United States Patent
Toya et al.

(10) Patent No.: US 10,669,646 B2
(45) Date of Patent: Jun. 2, 2020

(54) NICKEL MANGANESE COMPOSITE HYDROXIDE PARTICLES AND MANUFACTURING METHOD THEREOF, CATHODE ACTIVE MATERIAL FOR A NON-AQUEOUS ELECTROLYTE SECONDARY BATTERY AND MANUFACTURING METHOD THEREOF, AND A NON-AQUEOUS ELECTROLYTE SECONDARY BATTERY

(71) Applicant: SUMITO METAL MINING CO., LTD., Tokyo (JP)

(72) Inventors: Hiroyuki Toya, Niihama (JP); Kensaku Mori, Niihama (JP); Shin Imaizumi, Niihama (JP); Kenji Ikeuchi, Niihama (JP); Toshiyuki Osako, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 25 days.

(21) Appl. No.: 15/989,147

(22) Filed: May 24, 2018

(65) Prior Publication Data
US 2018/0347069 A1 Dec. 6, 2018

Related U.S. Application Data

(62) Division of application No. 13/820,110, filed as application No. PCT/JP2011/057694 on Mar. 28, 2011, now Pat. No. 10,017,875.

(51) Int. Cl.
*H01M 4/525* (2010.01)
*C30B 7/14* (2006.01)
(Continued)

(52) U.S. Cl.
CPC .............. *C30B 7/14* (2013.01); *C01G 53/006* (2013.01); *C01G 53/50* (2013.01);
(Continued)

(58) Field of Classification Search
CPC .............................. H01M 4/505; H01M 4/525
(Continued)

(56) References Cited

U.S. PATENT DOCUMENTS

| 6,255,020 B1 | 7/2001 | Yamashita et al. |
| 2006/0081818 A1* | 4/2006 | Ito .................... C01G 53/006 252/500 |

(Continued)

FOREIGN PATENT DOCUMENTS

| JP | 8-315822 | 11/1996 |
| JP | 2003-17049 | 1/2003 |

(Continued)

OTHER PUBLICATIONS

English translation of Hashimoto, JP-2008147068-A, Jun. 2008, Japan.*

(Continued)

*Primary Examiner* — Cynthia H Kelly
*Assistant Examiner* — Rashid A Alam
(74) *Attorney, Agent, or Firm* — Locke Lord LLP; James E. Armstrong, IV; Nicholas J. DiCeglie, Jr.

(57) ABSTRACT

Provided are nickel manganese composite hydroxide particles having a small and uniform particle size and having a double structure which enables to obtain a cathode active material having a hollow structure, and a manufacturing method thereof. When obtaining the nickel manganese composite hydroxide by a reaction crystallization, using an aqueous solution for nucleation, which includes at least a metallic compound that contains nickel, a metallic compound that contains manganese and an ammonium ion donor and controlling the pH value that is measured at a standard solution temperature of 25° C. is 10.5 to 12.0, nucleation is performed in an oxidizing atmosphere in which the oxygen concentration is greater than 1% by volume, and then nuclei (Continued)

are grown by switching the atmosphere from the oxidizing atmosphere to a mixed atmosphere of oxygen and inert gas in which the oxygen concentration is 1% by volume or less.

20 Claims, 7 Drawing Sheets

(51) Int. Cl.
| | | |
|---|---|---|
| *H01M 4/505* | (2010.01) | |
| *C01G 53/00* | (2006.01) | |
| *H01M 4/04* | (2006.01) | |
| *H01M 4/36* | (2006.01) | |
| *H01M 10/0525* | (2010.01) | |

(52) U.S. Cl.
CPC ....... *H01M 4/0471* (2013.01); *H01M 4/0497* (2013.01); *H01M 4/505* (2013.01); *H01M 4/525* (2013.01); *C01P 2002/52* (2013.01); *C01P 2004/03* (2013.01); *C01P 2004/34* (2013.01); *C01P 2004/51* (2013.01); *C01P 2004/61* (2013.01); *C01P 2004/62* (2013.01); *C01P 2006/40* (2013.01); *H01M 4/366* (2013.01); *H01M 10/0525* (2013.01); *Y10T 428/2982* (2015.01)

(58) Field of Classification Search
USPC ........................................................ 429/223
See application file for complete search history.

(56) References Cited

U.S. PATENT DOCUMENTS

| | | | | |
|---|---|---|---|---|
| 2006/0263690 | A1* | 11/2006 | Suhara | C01G 51/006 |
| | | | | 429/231.3 |
| 2008/0311473 | A1* | 12/2008 | Sasaoka | H01M 4/364 |
| | | | | 429/223 |
| 2009/0029253 | A1* | 1/2009 | Itou | H01M 4/525 |
| | | | | 429/223 |
| 2009/0035659 | A1* | 2/2009 | Takeuchi | H01M 4/131 |
| | | | | 429/223 |
| 2011/0059363 | A1 | 3/2011 | Imanari et al. | |
| 2011/0129727 | A1 | 6/2011 | Ahn et al. | |

FOREIGN PATENT DOCUMENTS

| | | | | |
|---|---|---|---|---|
| JP | 2003-86182 | | 3/2003 | |
| JP | 2004-193115 | | 7/2004 | |
| JP | 2004-210550 | | 7/2004 | |
| JP | 2004-253174 | | 9/2004 | |
| JP | 2004253174 | A * | 9/2004 | |
| JP | 2008-013206 | | 1/2008 | |
| JP | 2008-120679 | | 5/2008 | |
| JP | 2008-147068 | | 6/2008 | |
| JP | 2008147068 | A * | 6/2008 | |
| JP | 2008-235157 | | 10/2008 | |
| JP | 2008-243448 | A | 10/2008 | |
| WO | WO-2011067937 | A1 * | 6/2011 | ............ H01M 4/485 |

OTHER PUBLICATIONS

English translation of Tokuno, JP-2004253174-A, Sep. 2004, Japan.*
English-language International Search Report from the Japanese Patent Office, dated Jun. 28, 2011, for International Application No. PCT/JP2011/057694.
Ohzuki, T et a., "Layered Lithium Insertion Material of LiNi1/2Mn1/2O2: A Possible Alternative to LiCoO2 for Advanced Lithium-Ion Batteries," The Chemical Society of Japan, p. 744-745, vol. 30, No. 8, (2011).
Office Action of the Intellectual Property Office of Japan in Japanese Patent Application No. 2011800581517, dated Dec. 2, 2014, and English translation thereof.
Lee, M. H. et al., "Synthetic optimization of Li[Ni$_{1/3}$Co$_{1/3}$Mn$_{1/3}$]O$_2$ via co-precipitation", Electrochimica Acta 50, p. 939-948, (2004).
English Translation of JP 2008-243448 A, Kikuchi, Kazuhiro, 19-2008, Japan.
English Translation of JP 2004-193115 A, Tokuno, Junichi, Jul. 2004, Japan.
Lee et al., "Synthetic optimization of Li{Ni1/3Co1/3Mn1/3}O2 via Co-precipitation" Electrochimica Acta, 2004, o. 50, pp. 939-946.

* cited by examiner

NICKEL MANGANESE COMPOSITE HYDROXIDE PARTICLES AND MANUFACTURING METHOD THEREOF, CATHODE ACTIVE MATERIAL FOR A NON-AQUEOUS ELECTROLYTE SECONDARY BATTERY AND MANUFACTURING METHOD THEREOF, AND A NON-AQUEOUS ELECTROLYTE SECONDARY BATTERY

This application is a divisional of application Ser. No. 13/820,110, filed Jul. 11, 2013 (allowed), which is a 371 of PCT/JP2011/0794, filed Mar. 28, 2011, all of which are incorporated herein by reference.

TECHNICAL FIELD

The present invention relates to nickel manganese composite hydroxide particles and the manufacturing method thereof, cathode active material for a non-aqueous electrolyte secondary battery, which uses the nickel manganese composite hydroxide particles as an ingredient, and the manufacturing method thereof, and a non-aqueous electrolyte secondary battery that uses the cathode active material for a non-aqueous electrolyte secondary battery as the cathode material.

BACKGROUND ART

In recent years, as portable electronic devices such as mobile telephones and notebook personal computers become widespread, there is a large need for development of compact and lightweight non-aqueous electrolyte secondary batteries that have high energy density. Moreover, there is also a strong need for development of a high-output secondary battery as a motor drive battery, and particularly, as a battery for the power source of transport equipment.

As a secondary battery that satisfies this kind of need is a lithium-ion secondary battery. A lithium-ion secondary battery comprises an anode, a cathode and an electrolyte, and a material in which lithium can be desorbed and inserted is used as the active material for the anode and cathode.

Currently, much research and development is being performed related to lithium-ion secondary batteries, and of that, research of lithium-ion batteries that use lithium metal composite oxide having layered structure or spinel structure as the cathode material has been advancing as high-energy density batteries that are capable of 4V class high voltage.

Currently, as the cathode material of that kind of lithium-ion secondary battery, lithium metal composite oxides such as lithium cobalt composite oxide ($LiCoO_2$) having a relatively simple composition, lithium nickel composite oxide ($LiNiO_2$), which uses nickel that is less expensive than cobalt, lithium nickel manganese cobalt composite oxide ($LiNi_{1/3}Co_{1/2}Mn_{1/3}O_2$), lithium manganese composite oxide ($LiMn_2O_4$) that uses manganese, and lithium nickel manganese composite oxide ($LiNi_{0.5}Mn_{0.5}O_2$) have been proposed.

Even of these cathode active materials, lithium nickel manganese composite oxide (($LiNi_{0.5}Mn_{0.5}O_2$), which is high capacity, has excellent thermal stability and does not use cobalt of which there are few reserves, has gained much attention in recent years. Lithium nickel manganese composite oxide (($LiNi_{0.5}Mn_{0.5}O_2$) is layered in the same way as lithium cobalt composite oxides and lithium nickel composite oxides, and nickel and manganese are included in transitional metal sites at basically a compositional ratio of 1:1 (see Chemistry Letters, Vol. 30 (2001), No. 8, p. 744).

Incidentally, as a condition for a lithium ion secondary battery to obtain good performance characteristics (high cyclability, low resistance, high output) cathode material comprising particles having a uniform and suitable particle size is required.

This is because, when a cathode material having a large particle size and low specific surface area is used, the reactive area with the electrolyte cannot be sufficiently maintained, so the reaction resistance rises, and it is not possible to obtain a battery having high output. Moreover, when a cathode material having a wide particle size distribution is used, the voltage applied to the particles in the electrode become uneven, and when the battery is repeatedly recharged, small particles selectively deteriorate, and the capacity decreases.

In aiming for high output of a lithium-ion secondary battery, shortening the distance between the cathode and anode is effective, so preferably the cathode plate is made to be thin, and from this aspect as well, using cathode material having a small particle size is useful.

Therefore, in order to improve the performance of the cathode material, it is important that lithium nickel manganese composite oxide, which is a cathode active material, be manufactured so that the particle size is small and uniform.

Lithium nickel manganese composite oxide is normally manufactured from composite hydroxide, so in order to make the lithium nickel manganese composite oxide particles small with a uniform particle size, it is necessary to use a composite hydroxide as the raw material that has small particles with a uniform particle size.

In other words, in order to improve the performance of the cathode material and manufacture a high-performance lithium-ion secondary battery as a final product, it is necessary to use a composite hydroxide that comprises particles having a small particle size and narrow particle distribution as the composite hydroxide that will become the raw material of the lithium nickel manganese composite oxide used in forming the cathode material.

As a nickel manganese composite hydroxide that is used as the raw material of a lithium nickel manganese composite oxide, manganese nickel composite hydroxide particles are proposed in JP2004-210560(A) which are composite hydroxide particles having a manganese to nickel ratio of 1:1, with an average particle size of 5 to 15 μm, tap density of 0.6 to 1.4 g/ml, bulk density of 0.4 to 1.0 g/ml, specific surface area of 20 to 55 $m^2/g$, amount of sulfate contained being 25 to 45 weight %, and in X-ray diffraction, a ratio ($I_0/I_1$) of the maximum strength ($I_0$) of the peak in the range 15≤2θ≤25 and the maximum strength ($I_1$) of the peak in the range 30≤2θ≤40 of 1 to 6. The secondary particle surface and internal structure is formed in a netlike structure with fold-like walls of primary particles, with the space surrounded by the fold-like walls being relatively large.

Furthermore, as the manufacturing method, a method is disclosed in which, while keeping the amount of oxidation of manganese ions within a set range, a mixed aqueous solution of manganese salt and nickel salt having an atomic ratio of manganese and nickel of 1:1 is mixed and reacted with an alkaline solution in an aqueous solution having a pH or 9 to 13 with the existence of a complexing agent to cause coprecipitation of particles.

However, in the case of the lithium manganese nickel composite oxide and manufacturing method disclosed in JP2004-210560(A), although the structure of the particles is considered, it can be clearly seen in the disclosed electron micrograph that coarse particles and fine particles are mixed together in the obtained particles, and making the particle size uniform has not been considered.

On the other hand, in regards to the particle size distribution of lithium composite oxide particles, a lithium composite oxide has been disclosed in JP2008-147068(A) such that in the particle size distribution curve, the particles have a particle size distribution with an average particle size D50, which means the particle size of a cumulative frequency of 50%, of 3 to 15 μm, a minimum particle size of 0.5 μm or greater, and a maximum particle size of 50 μm or less, and where in the relationship between average particle size D10 at a cumulative frequency of 10% and D90 at a cumulative frequency of 90%, the ratio D10/D50 is 0.6 to 0.9, and the ratio D10/D90 is 0.30 to 0.70. It has also been disclosed that this lithium composite oxide has high repletion, excellent charge and discharge characteristic and high output characteristic, and does not easily deteriorate even under conditions of a large charge and discharge load, so by using this lithium composite oxide, a non-aqueous electrolyte lithium ion secondary battery having excellent output characteristics and little deterioration of cyclability can be obtained.

However, the lithium composite oxide disclosed in JP2008-147068(A) includes fine particles and coarse particles as seen from the fact that it has a minimum particle size 0.5 μm or greater and a maximum particle size of 50 μm or less with respect to an average particle size of 3 to 15 μm. The above particle size distribution that is regulated by D10/D50 and D10/D90 is not a narrow particle size distribution range. In other words, the lithium composite oxide of JP2008-147068(A) can be said to have sufficiently high uniformity of particle size, and when that lithium composite oxide is used, an improvement in performance of the cathode material cannot be expected, and it is difficult to obtain a non-aqueous electrolyte lithium-ion secondary battery having sufficient performance.

Moreover, a method for manufacturing a composite hydroxide that will become the raw material for a composite oxide aimed at improving the particle size distribution has been disclosed. In JP2003-086182(A), in a method for manufacturing a cathode active material for a non-aqueous electrolyte battery, a method for obtaining a hydroxide or oxide as a precursor is disclosed in which an aqueous solution containing two or more kinds of transition metal salts or two or more kinds of aqueous solutions of different transition metal salts is put into a reaction vessel together with an alkaline solution, and co-precipitation is performed while causing the solution to coexisting with a reducing agent or by passing an inert gas though the solution.

However, the technology disclosed in JP2003-086182(A) is for recovery while classifying the generated crystals, so in order to obtain a material having uniform particle size, strictly managing the manufacturing conditions is considered to be necessary, so production on an industrial scale is difficult. Moreover, even though it is possible to obtain crystal grain having a large grain size, obtaining small particles is difficult.

Furthermore, in order to make a battery with high output, increasing the size of the reactive area without changing the particle size is effective. In other words, by making particles that are porous, or that have a hollow particle structure, it is possible to increase the surface area that contributes to the battery reaction, and it is possible to reduce the reaction resistance.

For example, in JP2004-253174(A) cathode active material for a non-aqueous electrolyte secondary battery comprising a lithium transition metal composite oxide at least having a layered structure is disclosed wherein the lithium transition metal composite oxide comprises hollow particles having a shell section on the outside and a hollow section on the inside of the outer shell section. Also disclosed is that this cathode active material for a non-aqueous electrolyte secondary battery has excellent battery characteristics such as cycle characteristics, output characteristics, thermal stability and the like, and can suitably be used for a lithium-ion secondary battery.

However, JP2004-253174(A) makes no mention of particle size of the cathode active material, while the cathode active material comprises hollow particles and therefore these particles are expected to have a greater specific surface area than solid particles. Therefore, improvement in reactivity with the electrolyte due to an increase in specific surface area can be expected, however, the effect on the migration distance of the lithium ions due to making the particles smaller is not clear, and a sufficient improvement in output characteristics cannot be expected. Furthermore, in regards to the particle size distribution, the particle size distribution is considered to be the same as in conventional cathode active material, so selective deterioration of minute particles due to uneven voltage that is applied inside the electrodes occurs, and there is a strong possibility that there will be a drop in battery capacity.

As described above, currently neither a lithium composite oxide that can sufficiently improve the performance of a lithium-ion secondary battery, nor a composite hydroxide that will become the raw material for that composite oxide have been developed. Moreover, after investigating various methods for manufacturing composite hydroxides, currently a method that is capable on an industrial scale to manufacture a composite hydroxide that can become the raw material for a composite oxide capable of improving the performance of a lithium-ion secondary battery has not been developed. In other words, a cathode active material having particles with a small and uniform particle size, and that have a large reactive area, for example having a hollow structure, remains to be developed, and a method capable of industrially manufacturing that kind of cathode active material is desired.

RELATED LITERATURE

Patent Literature

[Patent Literature 2] JP2004-210560(A)
[Patent Literature 2] JP2008-147068(A)
[Patent Literature 3] JP2003-086182(A)
[Patent Literature 4] JP2004-253174(A)

Non-Patent Literature

[Non-patent Literature 1] Chemistry Letters, Vol. 30 (2001), No. 8, p. 744

SUMMARY OF THE INVENTION

Problem to be Solved by the Invention

In consideration of the problems above, an object of the present invention is to provide nickel manganese composite hydroxide particles that, when used as a raw material, a lithium nickel manganese composite oxide is obtained that has small particles with a uniform particle size and that have a high specific surface area due to a hollow particle structure thereof.

Moreover, another object of the present invention is to provide a cathode active material for a non-aqueous electrolyte secondary battery that can reduce the value of the cathode resistance that is measured when used in a battery, and to provide a non-aqueous electrolyte secondary battery that uses that cathode active material and that has high capacity, good cyclability and high output.

Furthermore, another object of the present invention is to provide a method for industrially manufacturing the nickel manganese composite hydroxide particles and cathode active material.

Means for Solving the Problems

The inventors diligently gave thought to the structure of lithium nickel manganese composite oxide which is capable of displaying excellent battery characteristics when used as a cathode material for a lithium ion secondary battery, and as a result, learned that by controlling the particle size distribution of nickel manganese composite hydroxide, which is the raw material, and by giving the nickel manganese composite hydroxide the structure with a center section comprising fine primary particles and an outer shell section on the outside of the center section comprising of primary particles that are larger than the primary particles of the center section, it is possible to obtain lithium nickel manganese composite oxide having hollow structure and comprising small particles with a highly uniform particle size. Moreover, it was learned that the nickel manganese composite hydroxide can be obtained by dividing crystallization process into a nucleation step and a particle growth step by controlling the pH in the crystallization process and by controlling the atmosphere of each step. The present invention was achieved based on the above technical knowledge.

A manufacturing method for manufacturing nickel manganese composite hydroxide of the present invention is to manufacture nickel manganese composite hydroxide particles using a reaction crystallization, the nickel manganese composite hydroxide particles being expressed by a general formula of $Ni_xMn_yCo_zM_t(OH)_{2+a}$ (where x+y+z+t=1, 0.3≤x≤0.7, 0.1≤y≤0.55, 0≤z≤0.4, 0≤t≤0.1, 0≤a≤0.5, and M is one or more added elements that are selected from among Mg, Ca, Al, Ti, V, Cr, Zr, Nb, Mo and W), and the manufacturing method of the present invention comprises:

a nucleation step of controlling an aqueous solution for nucleation, which includes at least a metallic compound that contains nickel, a metallic compound that contains manganese, and an ammonium ion donor, so that a pH value thereof that is measured at a standard solution temperature of 25° C. is 12.0 to 14.0, and causing nucleation in an oxidizing atmosphere having an oxygen concentration of greater than 1% by volume; and a particle growth step of controlling an aqueous solution for particle growth, which includes nuclei formed in the nucleation step, so that a pH value thereof that is measured at a standard solution temperature of 25° C. is 10.5 to 12.0, and causing nuclear growth by switching from the oxidizing atmosphere to a mixed atmosphere of oxygen and inert gas having an oxygen concentration of 1% by volume or less within a range of 0 to 40% of the overall time of the particle growth step from the start of particle growth step.

Preferably, the oxygen concentration in the oxidizing atmosphere is 10% by volume or greater, however, on the other hand, the oxygen concentration in the mixed atmosphere is 0.5% by volume or less.

Preferably, switching in the particle growth step from the oxidizing atmosphere to the mixed atmosphere of oxygen and inert gas is performed within a range of 0 to 30% of the overall time of the particle growth step from the start of the particle growth step.

The aqueous solution for particle growth is obtained by adjusting the pH value of the aqueous solution for nucleation after the nucleation step has finished. Alternatively, the aqueous solution for particle growth is obtained by adding the aqueous solution for nucleation, which contains the nuclei formed in the nucleation step, to a solution that is separate from the aqueous solution for nucleation with the formed nuclei.

Furthermore, preferably, in the particle growth step, part of a liquid part of the aqueous solution for particle growth is excreted.

Moreover, preferably, in the nucleation step and the particle growth step, a temperature of the aqueous solution for nucleation and for particle growth is maintained at 20° C. or greater, and an ammonia concentration of the aqueous solution for nucleation and for particle growth is maintained within a range of 3 to 25 g/L.

Furthermore, in order to manufacture nickel manganese composite hydroxide particles that includes the one or more added elements, in the nucleation step and particle growth step, preferably, an aqueous solution, to which a salt that includes the one or more added elements are dissolved, is added to a mixed solution that includes a metal compound that contains nickel and a metal compound that contains manganese; or an aqueous solution in which a salt containing the one or more added elements are dissolved and the mixed aqueous solution are supplied at the same time to a crystallization tank that stores an aqueous solution before reaction that includes at least the ammonium ion donor in order to form the aqueous solution for nucleation. Alternatively, it is also possible to coat the nickel manganese composite hydroxide particles that were obtained in the particle growth process with the one or more added elements. As the coting method, there is a method of adding an aqueous solution that includes the one or more added elements to a solution in which the nickel manganese composite hydroxide is suspended, while controlling a pH thereof to a specified value, and then causing precipitation on a surface of the nickel manganese composite hydroxide particles, or there is a method of spray drying a slurry in which nickel manganese composite hydroxide particles and a salt that includes the one or more added elements are suspended, or there is a method of mixing nickel manganese composite hydroxide particles with a salt that includes the one or more added elements using a solid phase method.

The nickel manganese composite hydroxide particles of the present invention are expressed by the general formula of $Ni_xMn_yCo_zM_t(OH)_{2+a}$ (where x+y+z+t=1, 0.3≤x≤0.7, 0.1≤y≤0.55, 0≤z≤0.4, 0≤t≤0.1, 0≤a≤0.5, and M is one or more added elements that are selected from among Mg, Ca, Al, Ti, V, Cr, Zr, Nb, Mo and W), and are spherical shaped secondary particles that are formed by a plurality of aggregate primary particles, and the nickel manganese composite hydroxide particles of the present invention is characterized in that the secondary particles have an average particle size of 3 to 7 μm, a value [(d90−d10)/average particle size], which is an index indicating an extent of particle size distribution thereof, of 0.55 or less, the particles have a center section comprising fine primary particles, and an outer shell section on the outside of the center section comprising plate shaped primary particles that are larger than the fine primary particles.

Preferably, the fine primary particles have an average particle size of 0.01 to 0.3 μm, the plate shaped primary particles that are larger than the fine primary particles have an average particle size of 0.3 to 3 μm and a ratio of the thickness of the outer shell section with respect to the particle size of the secondary particles is 5 to 45%.

Moreover, preferably, the one or more added elements are uniformly distributed inside the secondary particles and/or uniformly cote the surface of the secondary particles.

Preferably, the nickel manganese composite hydroxide particles of the present invention are manufactured by the manufacturing method of the present invention for manufacturing nickel manganese composite hydroxide particles.

A manufacturing method for manufacturing cathode active material of the present invention is to manufacture a cathode active material for a non-aqueous electrolyte secondary battery for a non-aqueous electrolyte secondary battery comprising lithium nickel manganese composite oxide having a layered hexagonal crystal structure and expressed by the general formula of $Li_{1+u}Ni_xMn_yCo_zM_tO_2$ (where $-0.05 \leq u \leq 0.50$, $x+y+z+t=1$, $0.3 \leq x \leq 0.7$, $0.1 \leq y \leq 0.55$, $0 \leq z \leq 0.4$, $0 \leq t \leq 0.1$, M is one or more added elements that are selected from among Mg, Ca, Al, Ti, V, Cr, Zr, Nb, Mo and W), and the manufacturing method comprises:

heat treatment of the nickel manganese composite hydroxide particles of present invention as raw material at a temperature of 105 to 750° C.;

a mixing step that mixes a lithium compound into the heat treated particles to form a lithium mixture; and a calcination step that performs calcination of the mixture formed in the mixing step in an oxidizing atmosphere at a temperature of 800 to 980° C.

Preferably, the lithium mixture is adjusted so that a ratio between the sum of the number of metal atoms other than lithium included in the lithium mixture and the number of lithium atoms is 1:0.95 to 1.5.

Moreover, preferably, in the calcination step, temporary calcination has already been performed before calcination at a temperature of 350 to 800° C.

Furthermore, preferably, the oxidizing atmosphere during the calcination step is an atmosphere having an oxygen content of 18 to 100% by volume.

A cathode active material of the present invention comprises lithium nickel manganese composite oxide particles having a layered hexagonal crystal structure and expressed by the general formula of $Li_{1+u}Ni_xMn_yCo_zM_tO_2$ (where $-0.05 \leq u \leq 0.50$, $x+y+z+t=1$, $0.3 \leq x \leq 0.7$, $0.1 \leq y \leq 0.55$, $0 \leq z \leq 0.4$, $0 \leq t \leq 0.1$, M is one or more added elements that are selected from among Mg, Ca, Al, Ti, V, Cr, Zr, Nb, Mo and W), and the cathode active material has an average particle size of 2 to 8 μm, a value [(d90–d10)/average particle size], which is an index indicating an extent of particle size distribution thereof, of 0.60 or less, and the cathode active material has a hollow structure provided with a hollow section inside the particles and an outer shell section of aggregated sintered primary particles formed on the outside of the hollow section.

Preferably, a ratio of the thickness of the outer shell section with respect to the particle size of the lithium nickel manganese composite oxide particles is 5 to 45%.

Preferably, this cathode active material for a non-aqueous electrolyte secondary battery of the present invention is generated by the manufacturing method for a cathode active material of the present invention.

In the non-aqueous electrolyte secondary battery of the present invention, the cathode is formed using the cathode active material for a non-aqueous electrolyte secondary battery according to the present invention described above.

Effect of the Invention

With the present invention, nickel manganese composite hydroxide particles are obtained that have a small and highly uniform particle size, which can be used as raw material to manufacture lithium nickel manganese composite oxide having a high specific surface area due to hollow structure thereof. Moreover, cathode active material comprising the lithium nickel manganese composite oxide can provide high capacity, good cycle characteristic and high output when used in a non-aqueous electrolyte secondary battery, and a non-aqueous electrolyte secondary battery that is formed using this cathode active material has excellent battery characteristics.

The manufacturing methods for manufacturing the nickel manganese composite hydroxide particles and the cathode active material that are provided by the present invention are simple and suitable for large-scale production, so the industrial value of the invention is very large.

MODE FOR CARRYING OUT THE INVENTION

Figure 1:
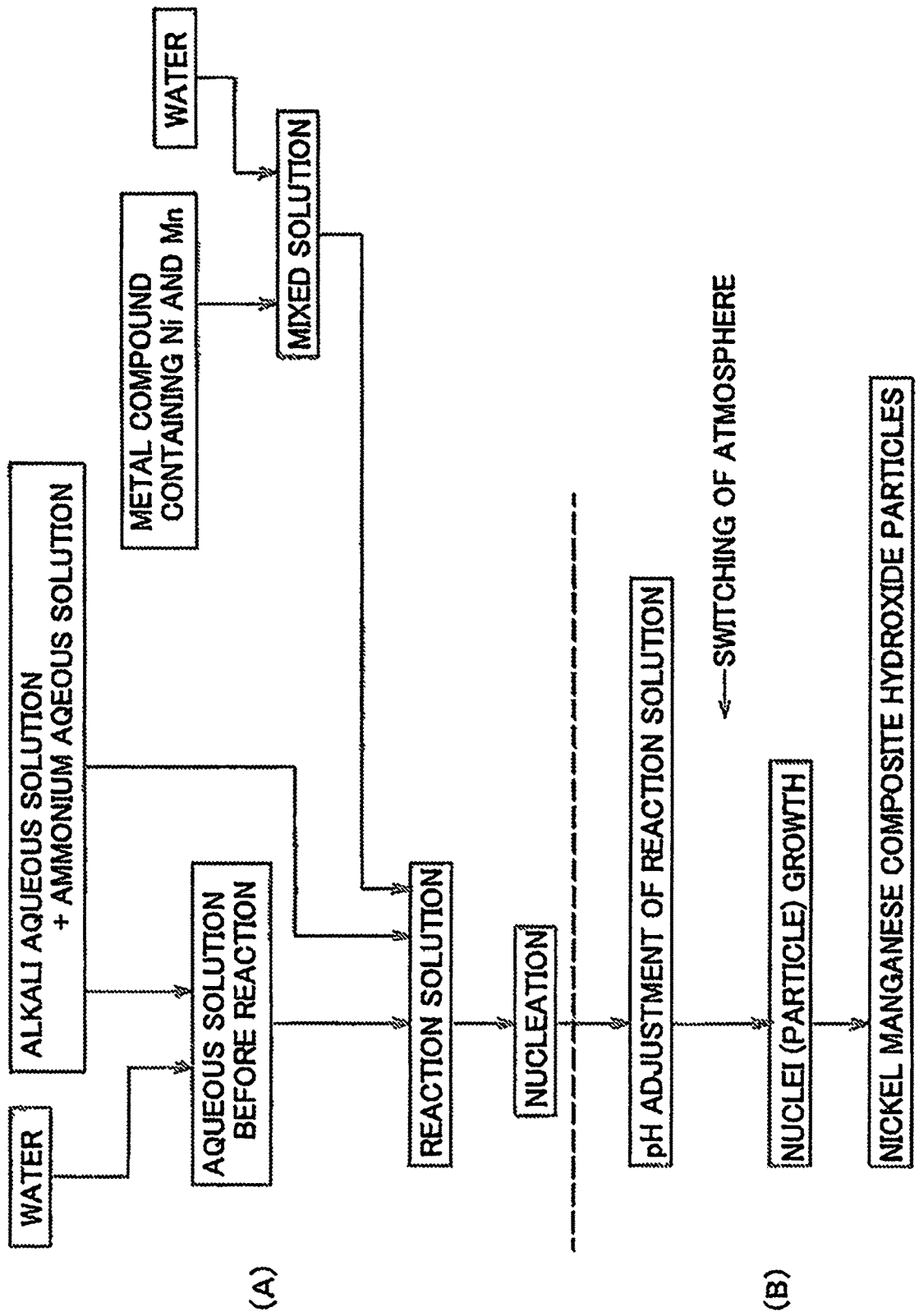
FIG. 1 is a flowchart of a process for manufacturing the nickel manganese composite hydroxide of the present invention.

The present invention relates to (1) nickel manganese composite hydroxide particles, which are the raw material for a cathode active material for a non-aqueous electrolyte secondary battery and the manufacturing method thereof, (2) a cathode active material for a non-aqueous electrolyte secondary battery that is obtained by using the nickel manganese composite hydroxide as raw material and the manufacturing method thereof, and (3) a non-aqueous electrolyte secondary battery that is obtained by using the cathode active material for a non-aqueous electrolyte secondary battery for the cathode.

In order to improve the performance of a non-aqueous electrolyte secondary battery, the effect of a cathode active material for a non-aqueous electrolyte secondary battery that is used for the cathode is large. In order to obtain a cathode active material for a non-aqueous electrolyte secondary battery that can obtain excellent battery performance, the particle size, particle size distribution and the specific surface area are important factors, and a cathode active material having a desired particle structure, and that has been adjusted to have a desired particle size and particle size distribution is preferred. In order to obtain that kind of cathode active material, it is necessary to use a nickel manganese composite hydroxide as raw material that has a desired particle structure as well as a desired particle size and particle size distribution.

The invention according to (1) to (3) above is described in detail below, however, first, the nickel manganese composite hydroxide particles and manufacturing method thereof, which are the main features of the present invention, will be explained.

(1-1) Nickel Manganese Composite Hydroxide Particles

The nickel manganese composite hydroxide particles of the present invention are expressed by the general expression of $Ni_xMn_yCo_zM_t(OH)_{2+a}$ (where x+y+z+t=1, 0.3≤x≤0.8, 0.1≤y≤0.55, 0≤z≤0.4, 0≤t≤0.1, 0≤a≤0.5, and M is one or more additional elements that are selected from among Mg, Ca, Al, Ti, V, Cr, Zr, Nb, Mo and W), and are constructed by spherical secondary particles that are formed from an aggregation of a plurality of plate shaped primary particles, and the secondary particles have an average particle size of 3 to 7 µm, the index for indicating the spread of the particle size distribution [(d90−d10)/average particle size] is 0.55 or less, and have a center section comprising fine primary particles and an outer shell section on the outside of the center section that comprises plate shaped primary particles that are larger than the fine primary particles.

The composite hydroxide particles above are particularly suited as the raw material for the cathode active material having a hollow structure of the present invention, so in the following explanation it is presumed that these composite hydroxide particles are used as the raw material for the cathode active material of the present invention.

(Particle Structure)

Figure 5:
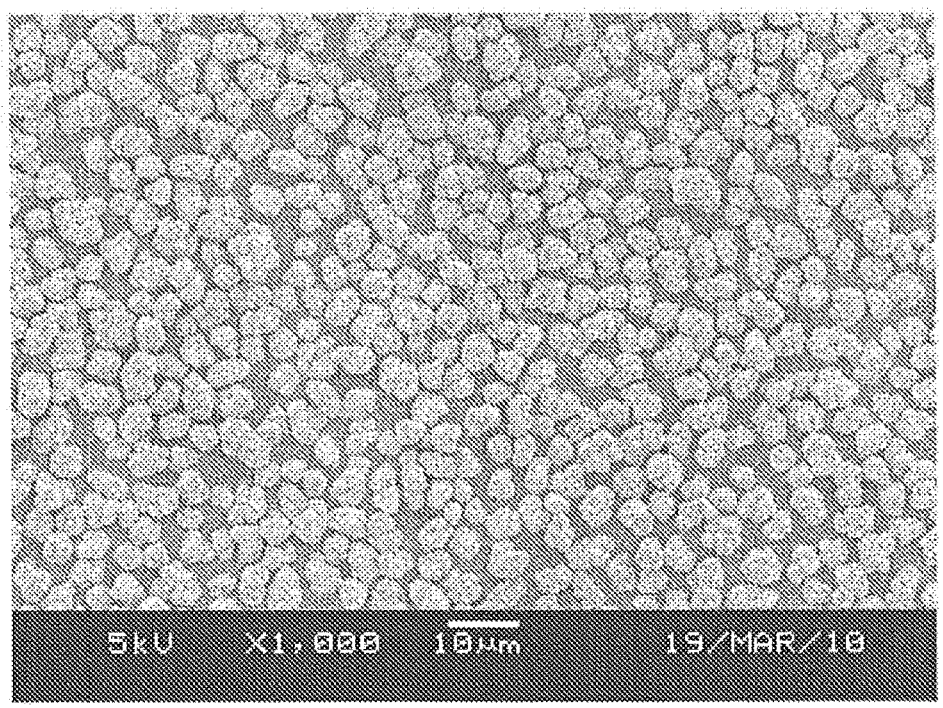
FIG. 5 is an SEM photograph of the nickel manganese composite hydroxide of the present invention (with 1,000 magnification).
Figure 6:
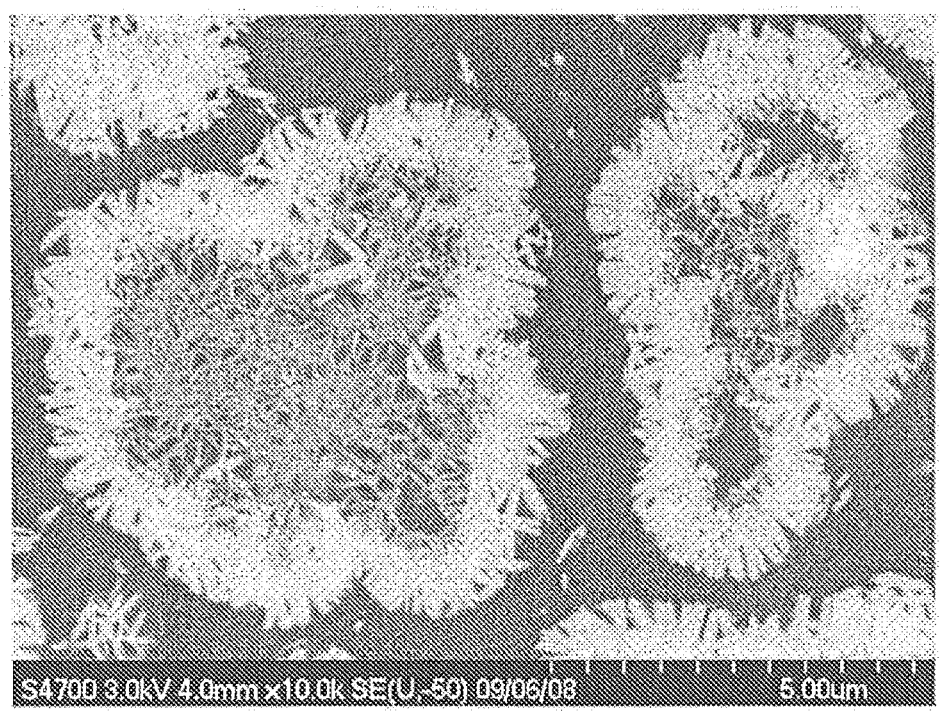
FIG. 6 is an SEM photograph of a cross section of the nickel manganese composite hydroxide of the present invention (with 10,000 magnification).

As illustrated in FIG. 5, the composite hydroxide particles of the present invention are spherical particles. More specifically, as illustrated in FIG. 6, a plurality of primary particles are aggregated together to form spherical secondary particles, even more specifically, the particles comprise a structure wherein the interior of the particles have a center section comprising fine primary particles, and an outer shell section on the outside of the center section comprising a plate shaped primary particles that are larger than the fine primary particles. With this structure, in the sintering process for forming the lithium nickel manganese composite oxide, which is the cathode active material of the present invention, dispersion of lithium inside the particles is performed sufficiently, so it is possible to obtain a good cathode active material having a uniform distribution of lithium.

Here, the center section is a structure comprising a collection of fine primary particles, so when compared with the outer shell section that comprises larger thick plate shaped primary particles, in the sintering process above, a contraction of the center section due to sintering start from a lower temperature. Therefore, during calcination, sintering proceeds from a low temperature, and the contraction proceeds to the outer shell side where progress of sintering is slow, so space occurs in the center section. The center section is considered to be low density, and the contraction rate is also high, so a sufficiently large space is formed in the center section. As a result, the cathode active material that is obtained after calcination has a hollow structure.

Moreover, it is more preferable that the outer shell of secondary particles be formed with the plate shaped primary particles being aggregated in random directions. By the plate shaped primary particles being aggregated in random directions, nearly uniform gap occurs between the primary particles, and when mixing and calcining the composite hydroxide particles with the lithium compound, the molten lithium compound moves inside the secondary particles, and dispersion of the lithium is adequately performed.

Furthermore, by aggregating those particles in random directions, contraction of the particles of the center section during the calcination process occurs evenly, so it is possible to form spaces of suitable size inside the cathode active material, which is preferred.

In order to form space during the calcination process, preferably the average particle size of the fine primary particles is 0.01 to 0.3 µm, and more preferably is 0.1 to 0.3 µm. Moreover, preferably the average particle size of the plate shaped primary particles, which are larger than the fine primary particles, is 0.3 to 3 µm, and more preferably is 0.4 to 1.5 µm, and particularly, even more preferably is 0.4 to 1.0 µm. When the average particle size of the fine primary particles is less than 0.01 µm, a center section having a sufficient size may not be formed in the composite hydroxide particles, and when the average particle size is greater then 0.3 µm, the lower temperature at the start of sintering and contraction of the center section are not sufficient, so it is possible that a space of adequate size will not be obtained after calcination. On the other hand, when the average particle size of the plate shaped particles of the outer shell section is less than 0.3 µm, sintering is performed at low temperature during calcination, and it may not be possible to obtain space having an sufficient size, and when greater than 3 µm, in order for the crystallinity of the obtained cathode active material to be suitable, it is necessary to increase the calcination temperature, so sintering will occur between the secondary particles and the particle size of the obtained cathode active material will exceed the range above.

Furthermore, preferably the fine primary particles are plate shaped and/or needle shaped. By the fine primary particles having these shapes, the density of the center section is sufficiently low, large contraction occurs due to calcination, and a sufficient amount of space is created.

Moreover, in the case of the secondary particles above, preferably the thickness of the outer shell section is 5 to 45% the particle size of the secondary particles, and more preferably 7 to 35%. The cathode active material that is obtained with the composite hydroxide above as the raw material has hollow structure, and the ratio of the thickness of the outer shell section with respect to the particle size is maintained at that ratio for the composite hydroxide secondary particles above. Therefore, by keeping the ratio of the thickness of the outer shell section with respect to the size of the secondary particles within the range above, it is possible to form a sufficient hollow section in the lithium nickel manganese composite oxide particles. When the thickness of the outer shell section is so thin that the ratio with respect to the particle size of the secondary particles is less than 5%, the contraction of the composite hydroxide particles in the calcination process when manufacturing the cathode active material becomes large, and sintering occurs between the secondary particles of the lithium nickel manganese composite oxide, so there is a possibility that the particle size distribution of the cathode active material will become poor. On the other hand, when the ratio exceeds 45%, problems such as not being able to form a sufficiently large center section may occur.

The particle size of the fine primary particles and the plate shaped primary particles, and the ratio of the thickness of the outer shell section with respect to the particle size of the secondary particles can be measured by using a scanning electron microscope to observe the cross section of the nickel manganese composite hydroxide particles.

For example, a plurality of nickel manganese composite hydroxide particles (secondary particles) can be embedded in resin or the like, and through cross-section polisher processing or the like, can be put into a state such that the cross section can be observed. The particle size of the fine primary particles and the plate shaped primary particles can be found by measuring as the maximum diameter of the cross section of preferably 10 or more of the primary particles in the secondary particle, and calculating the average.

Moreover, the ratio of the thickness of the outer shell section with respect to the particle size of the secondary particles can be found as described below. From among the secondary particles in the resin above, particles in the center whose cross section can be observed are selected, and at three or more arbitrary locations, the distance between two points where the distance from the outer surface of the outer shell section to the inner surface on the center section side is the shortest is measured, and the average thickness of the outer shell section for each particle is found. By taking the distance between two arbitrary points on the outer surface of the secondary particle to be the particle size of the secondary particle, and dividing the average thickness by the particle size of the secondary particle, the ratio of the thickness of the outer shell section with respect to the particle size is found for each particle. Furthermore, by averaging the ratios that were found for 10 or more particles, it is possible to find the ratio of the thickness of the outer shell section with respect to the particle size of the secondary particles for the nickel manganese composite hydroxide particles above.

(Average Particle Size)

The average particle size of the composite hydroxide particles of the present invention is adjusted to be 3 to 7 μm, and preferably 3.5 to 6.5 μm. By making the average particle size 3 to 7 μm, the cathode active material that is obtained using the composite hydroxide particles of the present invention as raw material can be adjusted to have a specified average particle size (2 to 8 μm). The particle size of the composite hydroxide particles is correlated with the particles size of the cathode active material that is obtained, so affects the characteristics of a battery that uses this cathode active material as the cathode material.

More specifically, when the average particle size of the composite hydroxide particles is less than 3 μm, the average particle size of the obtained cathode active material also becomes small, and the packing density of the cathode decreases, and the battery capacity per volume decreases. On the other hand, when the average particle size of the composite hydroxide particles exceeds 7 μm, specific surface area of the cathode active material decreases, and by reducing the interface between the cathode active material and electrolyte the cathode resistance increases, and the output characteristics of the battery decreases.

(Particle Size Distribution)

The composite hydroxide particles of the present invention are adjusted so that the index [(d90−d10)/average particle size)] that indicates the extent of the particle size distribution is 0.55 or less, and preferably 0.52 or less.

The particle size distribution of the cathode active material is greatly affected by the composite hydroxide particles, which are the raw material, so when fine particles or coarse particles are mixed with the composited hydroxide particles, similar particles also exist in the cathode active material. In other words, when [(d90−d10)/average particle size)] exceeds 0.55 and the extent of the particle size distribution is large, fine particles or coarse particles also exist in the cathode active material.

When the cathode is formed using cathode active material in which there are many fine particles, there is a possibility that heat will be generated due to localized reaction of the fine particles, and together with a decrease in the safety of the battery, the fine particles selectively deteriorate, so the cyclability of the battery becomes poor. On the other hand, when the cathode is formed using cathode active material in which there are many large particles, there is not sufficient reaction area between the electrolyte and the cathode active material, and the output of the battery decreases due to an increase in the reaction resistance.

Therefore, the composite hydroxide particles of the present invention are adjusted so that [(d90−d10)/average particle size] is 0.55 or less, and the range of particle size distribution of the cathode active material that is obtained by using these composite hydroxide particles as raw material becomes small, so it is possible to make the particle size uniform. In other words, the particle size distribution of cathode active material can be adjusted such that [(d90−d10)/average particle size] is 0.60 or less. As a result, in a battery in which cathode active material that is formed using the composite hydroxide particles of the present invention is used as the cathode material, it is possible to achieve good cyclability and high output.

In the index [(d90−d10)/average particle size] that indicates the extent of the particles size distribution, d10 is the particle size when the number of particles of each particle size from the side of small particle size is cumulatively totaled, and that accumulated volume is 10% of the total volume of all particles. Moreover, d90 is the particle size when the number of particles is similarly totaled, and that accumulated volume is 90% the total volume of all particles.

The method for finding the average particle size, d90 and d10 is not particularly limited, however, for example, they can be found from the volume integrated value that is measured using a laser diffraction scattering particle size analyzer. When d50 is used as the average particle size, it is possible to use the particle size when, as in the case of d90, the accumulated volume is 50% the entire particle volume.

(Particle Composition)

The composite hydroxide particles of the present invention are adjusted so that the composition is expressed by the following general formula. By manufacturing a lithium nickel manganese composite oxide with a nickel manganese composite hydroxide having the this composition as the raw material, and when using an electrode having that lithium nickel manganese composite oxide as the cathode active material in a battery, not only is it possible to lower the value of the measured cathode resistance, but it is also possible to improve the battery performance.

General Formula: $Ni_xMn_yCo_zM_t(OH)_{2+a}$ ($x+y+z+t=1$, $0.3 \leq x \leq 0.7$, $0.1 \leq y \leq 0.55$, $0 \leq z \leq 0.4$, $0 \leq t \leq 0.1$, $0 \leq a \leq 0.5$, M is one or more additional elements that are selected from among Mg, Ca, Al, Ti, V, Cr, Zr, Nb, Mo and W.)

When cathode active material with composite hydroxide particles as the raw material is obtained, the composition ratio (Ni:Mn:Co:M) of the composite hydroxide particles is maintained in the obtained cathode active material. Therefore, the composition ratio of the composite hydroxide particles of the present invention is adjusted so as to be the same as the composition ratio that is required for the cathode active material to be obtained.

(1-2) Method for Manufacturing Nickel Manganese Composite Hydroxide Particles

The method for manufacturing the composite hydroxide particles of the present invention is a method for manufacturing nickel manganese composite hydroxide particles by reaction crystallization, and comprises: a) a nucleation step for performing nucleation, and b) a particle growth step that grows the nuclei that were created in the nucleation process.

In other words, in the conventional continuous crystallization method, the nucleation reaction and the particle growth reaction proceeded simultaneously in the same tank, so the particle size distribution of the obtained composite hydroxide particles was over a wide range. On the other hand, a feature of the manufacturing method for the composite hydroxide particles of the present invention is that, by clearly separating the time when nucleation reaction occurs (nucleation step) and the time when the particle growth reaction occurs (particle growth step), a narrow particle size distribution is achieved for the obtained composite hydroxide particles. In addition, another feature of the manufacturing method of the present invention is that, by controlling the atmosphere during the crystallization reaction, the particle structure of the obtained complex hydroxide particles has a center section composed of fine primary particles, and an outer shell section that is composed of primary particles that are larger that in the center section.

Figure 2:
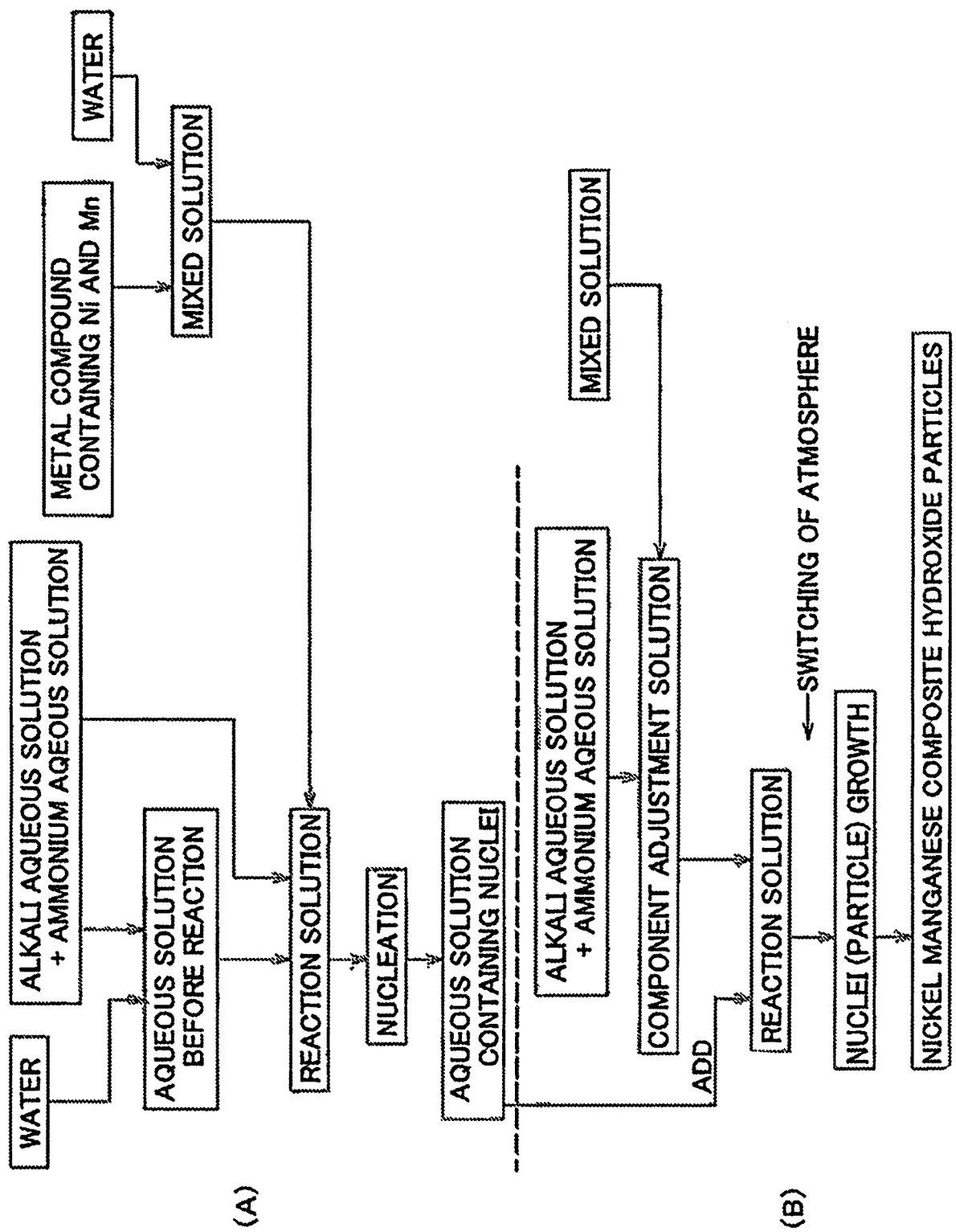
FIG. 2 is a flowchart of another process for manufacturing the nickel manganese composite hydroxide of the present invention.

First, a summary of the method for manufacturing the composite hydroxide particles of the present invention will be explained based on FIG. 1. In FIG. 1 and FIG. 2, (A) corresponds to the nucleation step and (B) corresponds to the particle growth step.

(Nucleation Step)

As illustrated in FIG. 1, first, a plurality of metallic compounds containing nickel and manganese are dissolved in water at specified ratios, to make the mixed aqueous solution. In the method for manufacturing the composite hydroxide particles of the present invention, the composition ratio of the metal in the obtained composite hydroxide particles is the same as the composition ratio of the metals in the mixed aqueous solution.

Therefore, the mixed aqueous solution is made by adjusting the ratio of the metal compounds to be dissolved in water, mainly nickel, manganese and cobalt, so that the composition ratio of the metals in the mixed aqueous solution is the same composition ratio as the metals in the composite hydroxide particles of the present invention.

On the other hand, alkali aqueous solution such as sodium hydroxide aqueous solution, ammonia aqueous solution that includes an ammonium ion donor, and water are supplied to the reaction tank and mixed to form an aqueous solution. This aqueous solution (hereafter, referred to as the "aqueous solution before reaction") is adjusted so that the pH value is within the range 12.0 to 14.0, and preferably within the range 12.3 to 13.5 and even more preferably within the range 12.5 to 13.0 at a standard solution temperature of 25° C. by adjusting the amount of alkali aqueous solution that is supplied. Moreover, the aqueous solution is adjusted so that the concentration of ammonium ion in the aqueous solution before reaction is 3 to 25 g/L, and preferably 5 to 20 g/L by adjusting the amount of ammonia aqueous solution that is supplied. The temperature of the aqueous solution before reaction is also preferably adjusted to be 20° C. or greater, and more preferably to be within the range 20 to 60° C. The pH value of the aqueous solution in the reaction tank can be measured using a typical pH meter, and the ammonium ion concentration can be measured with an ion meter.

In the reaction tank, after the temperature and pH of the aqueous solution before reaction have been adjusted, the mixed aqueous solution is supplied to the reaction tank while mixing with the aqueous solution before reaction. As a result, the aqueous solution before reaction is mixed with the mixed aqueous solution, and an aqueous solution for nucleation, which is the reaction solution for the nucleation step is formed, and minute nuclei of composite hydroxide are formed in the aqueous solution for nucleation. At this time, the temperature and pH of the aqueous solution for nucleation are within the range above, so the formed nuclei do not grow much, and nucleation occurs with priority.

The pH value and the ammonium ion concentration of the aqueous solution for nucleation changes during formation of the nuclei due to the supply of mixed aqueous solution, so alkali aqueous solution and ammonia aqueous solution are supplied together with mixed aqueous solution to the aqueous solution for nucleation, and the pH of the aqueous solution for nucleation is controlled so that the pH value at a standard solution temperature of 25° C. is kept within the range 12.0 to 14.0, and the ammonium ion concentration is controlled to be within the range 3 to 25 g/L.

By supplying the mixed aqueous solution, alkali aqueous solution and ammonia aqueous solution to the aqueous solution for nucleation, new nuclei are continuously generated in the aqueous solution for nucleation. After a specified number of nuclei are generated in the aqueous solution for nucleation, the nucleation step ends. Whether or not the specified number of nuclei has been generated is determined according to the amount of metal salt added to the aqueous solution for nucleation.

(Particle Growth Step)

After the nucleation step has finished, the pH of the aqueous solution for nucleation at a standard solution temperature of 25° C. is preferably adjusted to 10.5 to 12.0, and more preferably, to 11.0 to 12.0, so that pH value is lower than the pH value during the nucleation step, and an aqueous solution for particle growth, which is the reaction aqueous solution for the particle growth step, is obtained. More specifically, controlling the pH during this adjustment is performed by adjusting the amount of alkali aqueous solution that is supplied.

By keeping the pH value of the aqueous solution for particle growth within the range above, the growth reaction of the nuclei occurs with priority over the formation reaction of nuclei, so in the particle growth step, hardly any new nuclei are formed in the aqueous solution for particle growth, and the nuclei are grown (particle growth) and composite hydroxide particle having a specified particle size are formed.

Similarly, as particles are grown by supplying mixed aqueous solution, the pH value and ammonium ion concentration of the aqueous solution for particle growth changes, so the pH value of the aqueous solution for particle growth is controlled by supplying alkali aqueous solution and ammonia aqueous solution together with mixed aqueous solution to the aqueous solution for particle growth so that the pH value is kept within the range 10.5 to 12.0 at a standard solution temperature of 25° C., and the ammonium ion concentration is kept within the range 3 to 25 g/L.

After that, at the instant when the composite hydroxide particles have grown to a specified particle size, the particle growth step ends. The particle size of the composite hydroxide particles can be determined easily from preliminary testing from the amount of metal salt added to the reaction solutions in both the nucleation step and particle growth step, and when finding the relationship with the obtained particles, from the amount of metal salt added in each step.

As described above, in the case of the method for manufacturing composite hydroxide particles above, formation of nuclei takes precedence in the nucleation step with hardly any nucleus growth occurring, however, in the particle growth step only nucleus growth occurs, and hardly any new nuclei are formed. Therefore, in the nucleation step it is possible to form homogeneous nuclei having a narrow particle size distribution range, and in the particle growth process, it is possible to homogeneously grow nuclei. Consequently, in the method for manufacturing composite hydroxide particles, it is possible to obtain homogeneous nickel manganese composite hydroxide particles having a narrow particle size distribution range.

In the case of the manufacturing method above, in both steps, metallic ions become nuclei or crystallize out as composite hydroxide particles, so the ratio of the liquid component to the metallic component in the reaction solutions increases. In that case, apparently, the density of the mixed aqueous solution that is supplied is decreased, and particularly in the particle growth step, there is a possibility that composite hydroxide particles will not grow sufficiently.

Therefore, preferably, in order to suppress the increase of liquid component, part of the liquid component in the aqueous solution for particle growth is drained to outside the reaction tank after the nucleation step ends and during the particle growth step. More specifically, the supply of mixed aqueous solution, alkali aqueous solution and ammonia aqueous solution to the aqueous solution for particle growth and mixing is stopped, the nuclei and composite hydroxide particles are caused to precipitate out, and the supernatant liquid of the aqueous solution for particle growth is drained out. As a result, it is possible to increase the relative concentration of mixed aqueous solution in the aqueous solution for particle growth. Then, with the relative concentration of the mix aqueous solution high, it is possible to grow composite hydroxide particles, so it is possible to make the particle size distribution of the composite hydroxide particles even narrower, and thus it is also possible to increase the density of the composite hydroxide particles as secondary particles.

Moreover, in the embodiment illustrated in FIG. 1, after the nucleation step ends, an aqueous solution for particle growth is formed by adjusting the pH of the aqueous solution for nucleation, and then particle growth step is performed after the nucleation step, so there is an advantage in that it is possible to quickly change to the particle growth step. Furthermore, there is the advantage that changing from the nucleation step to the particle growth step can be performed easily by simply adjusting the pH of the reaction solution, and adjusting the pH can also be performed easily by temporarily stopping the supply of alkali aqueous solution. The pH of the reaction solution can also be adjusted by adding an inorganic acid that is the same kind as the acid of the metallic compounds into the reaction solution, for example, sulfuric acid is added in case of using sulfate as the metallic compounds.

However, in another embodiment as illustrated in FIG. 2, separate from the aqueous solution for nucleation, a component adjustment solution whose pH and ammonium ion concentration are adjusted to correspond to the particle growth step is formed, and a solution containing the nuclei that were formed in the nucleation step in a separate tank (aqueous solution for nucleation, and preferably, the aqueous solution from which part of liquid component has been removed) is added to this component adjustment solution to form a reaction solution, and the particle growth step can be performed with this reaction solution as the aqueous solution for particle growth.

In this case, it is possible to separate the nucleation step and particle growth step more completely, so the state of the reaction solution in each step can be taken to be an optimum condition for the step. Particularly, at the time when the particle growth step starts, the pH of the aqueous solution for particle growth can be taken to be the optimum condition. Therefore, the range of the particle size distribution of the nickel manganese composite hydroxide particles that are formed in the particle formation step can be narrower and more homogeneous.

(Reaction Atmosphere)

Next, control of the reaction atmosphere in each step, the material and solutions used in each step, and the reaction conditions will be explained in detail.

The particle structure of the nickel manganese composite hydroxide particles of the present invention is formed by controlling the atmosphere in the reaction tank during the nucleation step and particle growth step. Therefore, controlling the atmosphere in each of the steps of the manufacturing method has important significance. Growth of the primary particles that form the nickel manganese composite hydroxide particles is controlled according to the atmosphere in the reaction tank during the crystallization reaction, and in an oxidizing atmosphere, low-density particles having many gaps are formed from the fine primary particles, and in a weak oxidizing atmosphere to a non-oxidizing atmosphere, minute high-density particles with large primary particles are formed.

In other words, by using an oxidizing atmosphere for the nucleation step and part of the initial particle growth step, a center section composed of fine primary particles is formed, and in the particle growth step after that, by switching from the oxidizing atmosphere to an atmosphere within a range of from a low-oxidizing atmosphere to a non-oxidizing atmosphere, it is possible to for the particle structure above having an outer shell section composed of plate shaped primary particles that are larger than the fine primary particles of the center section.

In the crystallization reaction in which the atmosphere is controlled, normally, the primary particles in the center section are fine plate or needle shaped, and the primary particles of the outer shell section are plate shaped. However, the primary particles of the nickel manganese composite hydroxide above, depending on the composition, may also be rectangular, elliptical, trigonal or the like.

The oxidizing atmosphere for forming the center section described above of the present invention is defined as being an atmosphere wherein the oxygen concentration in the reaction tank space is greater than 1% by volume. An oxidizing atmosphere wherein the oxygen concentration is greater than 2% by volume is preferred, and an oxidizing atmosphere wherein the oxygen concentration is greater than 10% by volume is even more preferred; where an air atmosphere (oxygen concentration: 21% by volume) that is easily controlled is particularly preferred. By using an atmosphere wherein the oxygen concentration is greater than 1% by volume, it is possible to make the average particle size of the primary particles 0.01 to 0.3 μm. When the oxygen concentration is equal to or less than 1% by volume, the average particle size of the primary particles in the center section may exceed 0.3 μm. The upper limit of the oxygen concentration is not particularly limited, however, when the oxygen concentration exceeds 30% by volume, the average particle size of the primary particles may become less than 0.01 pan, which is not preferred.

On the other hand, the atmosphere in the range of from a weak oxidizing atmosphere to a non-oxidizing atmosphere for forming the outer shell described above of the present invention is defined by an atmosphere wherein the oxygen concentration of the space inside the reaction tank is 1% by volume or less. So that the oxygen concentration is preferably 0.5% by volume or less, and even more preferably, 0.2% by volume or less, the atmosphere is controlled to be a mixed atmosphere of oxygen and inert gasses. By making the oxygen concentration of the space inside the reaction tank 1% by volume or less and causing particles to grow, it is possible to suppress unnecessary oxidation of particles, promote growth of primary particles, and obtain secondary particles having a high-density shell section with uniform primary particles having an average particle size of 0.3 to 3 μm and larger than in the center section. As a method for keeping the space inside the reaction tank in this kind of atmosphere, there is a method of causing inert gas such as nitrogen to flow to the space inside the reaction tank, and further causing bubbling of inert gas in the reaction solution.

The timing for switching the atmosphere in the particle growth step is set by taking into consideration the size of the center section of the nickel manganese composite hydroxide particles so that a center section is obtained wherein cyclability does not become bad due to the occurrence of fine particles in the finally obtained cathode active material. For example, the switching is performed in a range of 0 to 40% of the time from the start of the particle growth process with respect to the entire particle growth processing time, and preferably, in the range of 0 to 30% of the time, and even more preferably, in a range of 0 to 25% of the time. When switching is performed at a point in time that exceeds 40% of the overall particle growth processing time, the formed center section becomes large, and the thickness of the outer shell section with respect to the particle size of the secondary particles becomes too thin. On the other hand, when switching is performed before the particle growth process, or in other words, performed during the nucleation process, the center section becomes too small, and secondary particles having the structure above are not formed.

(pH Control)

As described above, in the nucleation step, the pH value of the reaction solution must be controlled so that the pH value at a standard solution temperature of 25° C. is within the range 12.0 to 14.0, and preferably, within the range 12.3 to 13.5. When the pH value exceeds 14.0, the nuclei that are formed are too fine, and there is a problem that the reaction solution becomes a gel. Moreover, when the pH value is less than 12.0, the nucleus growth reaction occurs together with nucleation, so the range of the particle size distribution of the formed nuclei becomes large, and heterogeneous. In other words, in the nucleation step, by controlling the pH value of the reaction solution within the range above, it is possible to suppress nucleus growth, and promote only nucleation, and the formed nuclei are homogeneous and the particle size distribution range can be kept narrow.

On the other hand, in the particle growth step, the pH value of the reaction solution must be controlled so that the pH value at a standard solution temperature of 25° C. is within the range 10.5 to 12.0, and preferably, within the range 11.0 to 12.0. When the pH value exceeds 12.0, the amount of newly formed nuclei increases, and fine secondary particles are formed, so hydroxide particles having a good particle size distribution cannot be obtained. Moreover, when the pH value is less than 10.5, the solubility due to ammonium ions is high, and the amount of metal ions that remain in the solution without precipitating out increases, so production efficiency becomes poor. In other words, in the particle growth step, by controlling the pH of the reaction solution within the range above, it is possible to cause only growth of the nuclei formed in the nucleation step to occur and suppress the formation of new nuclei, and thus the obtained nickel manganese composite hydroxide particles are homogeneous and the particle size distribution range can be kept narrow.

In both the nucleation step and the particle growth step, preferably the range of fluctuation of the pH is kept within the set value ±0.2. When the range of fluctuation of the pH is large, nucleation and particle growth do not become fixed, and there is a possibility that uniform manganese composite hydroxide particles having a narrow particle size distribution range will not be obtained.

When the pH value is 12.0, this pH value is the boundary condition between nucleation and nucleus growth, so, depending on whether or not there are nuclei in the reaction solution, this pH value will become the condition for the nucleation step or the particle growth step.

In other words, after the pH value for the nucleation step is made to be greater than 12 a large quantity of nuclei are formed, then when the pH value for the particle growth step is made to be 12, there is a large quantity of nuclei in the reaction solution, so nucleus growth occurs with priority, and hydroxide particles have a narrow particle size distribution and relative large particle size are obtained.

On the other hand, when there are no nuclei in the reaction solution, or in other words, when the pH value during the nucleation step is 12, there are no nuclei that have grown, so the formation of nuclei takes precedence, and by lowering the pH value of the particle growth step to be less than 12, the nuclei that are formed grow and good hydroxide particles are obtained.

In either case, the pH value of the particle growth step should be controlled to be a value that is less than the pH value in the nucleation step, and in order to clearly separate nucleation from particle growth, the pH value of the particle growth step is preferably at least 0.5 less than the pH value of the nucleation step, and even more preferably at least 1.0 less.

(Nucleation Amount)

The amount of nuclei formed during the nucleation step is not particularly limited, however, in order to obtain composite hydroxide particles having good particle size distribution, preferably the amount is 0.1% to 2% of the total volume, or in other words the amount of all metal salts supplied to obtain the composite hydroxide particles, and more preferably 1.5% or less.

(Controlling the Particle Size of Composite Hydroxide Particles)

The particle size of the composite hydroxide particles above can be controlled by the time of the particle growth step, so by continuing the particle growth step until the particles have been grown to a desired particle size, it is possible to obtain composite hydroxide particles having a desired particle size.

Moreover, the particle size of the composite hydroxide particles can be controlled not only by the particle growth step, but also by the pH value of the nucleation step and the amount of raw material added for nucleation.

In other words, by making the pH value during nucleation the high pH value side, or by increasing the amount of raw material added by increasing the nucleation time, number of nuclei formed is increased. As a result, even when the particle growth conditions are kept the same, it is possible to make the particle size of the composite hydroxide particles small.

On the other hand, by performing control to reduce the number of nuclei formed, it is possible to increase the particle size of the obtained composite hydroxide particles.

In the following, the conditions for the metallic compounds, ammonia concentration in the reaction aqueous solution, reaction temperature and the like are explained, however, the difference between the nucleation step and the particle growth step is just the range for controlling the pH of the reaction aqueous solution and the atmosphere inside the reaction tank, with the conditions such as the metallic compounds, ammonia concentration in the reaction aqueous solution, reaction temperature and the like essentially being the same in both steps.

(Metal Compounds)

As metal compounds, compounds containing the target metals are used. The compounds used are preferably compounds that are water soluble such as nitrates, sulfates and hydrochlorides. For example, nickel sulfate, manganese sulfate and cobalt sulfate are preferably used.

(Added Elements)

Preferably, compounds that are water soluble are used as the sources of the added elements (one or more elements that are selected from among Mg, Ca, Al, Ti, V, Cr, Zr, Nb, Mo and W); for example, titanium sulfate, ammonium peroxotitanic, titanium potassium oxalate, vanadium sulfate, ammonium vanadate, chromium sulfate, potassium chromate, zirconium sulfate, niobium oxalate, ammonium molybdate, sodium tungstate, ammonium tungstate, and the like can be used.

When uniformly dispersing the added elements inside the composite hydroxide particles, it is only necessary to precipitate out the added elements into the composite hydroxide particles in a uniformly dispersed state by adding additives that contain the added elements to the mixed solution.

Moreover, when coating the surface of the composite hydroxide particles with the added elements, for example, by forming a slurry of composite hydroxide particles in an aqueous solution that includes the added elements, and performing control so that the pH becomes a specified value, then adding an aqueous solution that includes the one or more added elements and depositing the added elements onto the surface of the composite hydroxide particle by reaction crystallization, it is possible to uniformly cover the surface with the added elements. In this case, it is also possible to use an alkoxide solution of the added elements instead of an aqueous solution containing the added elements. Furthermore, it is also possible to coat the surface of the composite hydroxide particles with the added elements by spraying an aqueous solution or slurry containing the added elements on the composite hydroxide particles, and drying out the coated particles. Moreover, the surface can be coated by a method of spraying and drying slurry in which the composite hydroxide particles and salt including the one or more added elements are suspended, or mixing a composite hydroxide and salt containing the one or more added elements using a solid-phase method.

When coating the surface with added elements, by reducing the atomic ratios of the added element that exist in the mixed solution by just the amount of coating, it is possible to match the atomic ratios with the atomic ratios of the metal ions of the obtained composite hydroxide particles. The step of coating the surface of the particles with added elements can also be performed for the particles after the composite hydroxide particles have been heated.

(Mixed Solution Concentration)

Preferably, the concentration of the mixed solution is 1 to 2.6 mol/L for the total metallic compounds, and preferably 1.5 to 2.2 mol/L. When the concentration of the mixed solution is less than 1 mol/L, the amount of crystallization per reaction tank decreases, so productivity decrease, which is not preferable.

On the other hand, when the salt concentration of the mixed solution exceeds 2.6 mol/L, the concentration exceeds the saturated concentration at normal temperature, so crystals are reprecipitated and there is a danger that piping of the equipment will become blocked.

Moreover, the metallic compounds do not need to be supplied to the reaction tank as a mixed solution, and, for example, when using metallic compounds that are formed by reacting when mixed, separate metallic compound solutions can be prepared and the individual solutions of metallic compounds can be supplied at the same time to the reaction tank so that total concentration of metallic compound solution is within the range above.

Furthermore, that amount of mixed solution or amount of individual metallic compound solutions that are supplied to the reaction tank should be such that the concentration of crystallization at the time that the crystallization reaction ends is roughly 30 to 200 g/L, and preferably 80 to 150 g/L. When the concentration of crystallized material is less than 30 g/L, there is insufficient aggregation of primary particles, and when the concentration exceeds 200 g/L, the mixed solution that is added is not sufficiently dispersed inside the reaction tank, so there is a possibility that there will be deviation in particle growth.

(Ammonia Concentration)

The ammonia concentration in the reaction aqueous solution, in order that the following problems do not occur, is preferably kept at a constant value within the range of 3 to 25 g/L, and more preferably within the range of 5 to 20 g/L.

Ammonia is used as a complexing agent, and when the ammonia concentration is less than 3 g/L, it is not possible to maintain the solubility of metal ions constant, it is not possible to form plate shaped hydroxide primary particles having an orderly shape and particle size, and gel shaped nuclei are easily generated so the particle size distribution also easily increases.

On the other hand, when the ammonia concentration exceeds 25 g/L, the solubility of metal ions becomes too large, the amount of metal ions remaining in the reaction aqueous solution increases, and compositional distortion occurs.

Moreover, when the ammonia concentration fluctuates, the metal ion solubility fluctuates, and uniform hydroxide particles are not formed, so preferably the concentration is kept at a constant value. For example, preferably the ammonia concentration is kept at a desired concentration so that the difference between the upper limit and lower limit is 5 g/L.

The ammonium ion donor is not particularly limited, however, for example, ammonia, ammonium sulfate, ammonium chloride, ammonium carbonate, ammonium fluoride or the like is used.

(Reaction Temperature)

Inside the reaction tank, the temperature of the reaction solution is preferably 20° C. or greater, and particularly is set to preferably 20 to 60° C. When the temperature of the reaction solution is less than 20° C., the solubility is low, so the generation of nuclei occurs easily and control becomes difficult. On the other hand, when the temperature is greater than 60° C., the volatilization of the ammonia is promoted, so in order to maintain a specific ammonia concentration, an extra amount of the ammonium ion donor must be added, so the cost increases.

(Alkali Aqueous Solution)

In regards to the alkali aqueous solution that is used to adjust the pH of the reaction solution, the solution is not particularly limited; for example, it is possible to use an alkali metal hydroxide aqueous solution such as sodium hydroxide, potassium hydroxide and the like. In the case of alkali metal hydroxide, it is possible to supply that alkali metal hydroxide directly to the reaction solution, however, from the aspect of ease of control the pH of the reaction solution in the reaction tank, adding the alkali metal hydroxide to the reaction solution in the reaction tank as an aqueous solution thereof is preferred.

Moreover, the method for adding the alkali aqueous solution to the reaction tank is also not particularly limited, and can be added using a pump capable of flow control, such as a constant rate pump, while sufficiently mixing the reaction solution so that the pH value of the reaction solution is kept within the specified range.

(Manufacturing Equipment)

In the method for manufacturing composite hydroxide particles of the present invention, an apparatus is used that does not collect the produced material until the reaction is complete. For example, the apparatus is a typically used batch reaction tank in which a mixer is provided. When using this kind of apparatus, a problem of collecting growing particles at the same time as the overflow liquid, such as occurs in a continuous crystallization apparatus that collects the produced material by a typical overflow, does not occur, so it is possible to obtain particles having a narrow particle size distribution and uniform particle size.

Moreover, it is necessary to control the reaction atmosphere, so using an apparatus, such as a sealed apparatus, that is capable of atmosphere control is preferred. By using such an apparatus, it is possible to manufacture composite hydroxide particles having the structure above, and it is possible to uniformly promote the nucleation reaction and particle growth reaction, so it is possible to obtain particles having a good particle size distribution, or in other words, particles having a narrow particle size distribution range.

(2-1) Cathode Active Material for a Non-Aqueous Electrolyte Secondary Battery

The cathode active material of the present invention is lithium nickel manganese composite oxide particles that are represented by the general formula of $Li_{1+u}Ni_xMn_yCo_zM_tO_2$ (where $-0.05 \leq u \leq 0.50$), $x+y+z+t=1$, $0.3 \leq x \leq 0.7$, $0.1 \leq y \leq 0.55$, $0 \leq z \leq 0.4$, $0 \leq t \leq 0.1$, and M is one or more added elements that are selected from among Mg, Ca, Al, Ti, V, Cr, Zr, Nb, Mo and W), and has a layered hexagonal crystal structure.

(Composition)

The cathode active material of the present invention is lithium nickel manganese composite oxide particles, and the composition thereof is adjusted so as to satisfy the following general formula.

$$Li_{1+u}Ni_xMn_yCo_zM_tO_2 \quad \text{General formula:}$$

(where $-0.05 \leq u \leq 0.50$), $x+y+z+t=1$, $0.3 \leq x \leq 0.7$, $0.1 \leq y \leq 0.55$, $0 \leq z \leq 0.4$, $0 \leq t \leq 0.1$, and M is one or more added elements that are selected from among Mg, Ca, Al, Ti, V, Cr, Zr, Nb, Mo and W).

In the cathode active material of the present invention, u, which indicates the surplus amount of lithium, is within the range −0.5 to 0.50. When the surplus amount of lithium is less than −0.05, the reaction resistance of the cathode of the non-aqueous electrolyte secondary battery that uses the obtained cathode active material becomes large, so the output of the battery becomes low. On the other hand, when the surplus amount of lithium exceeds 0.05, the initial discharge capacity when the cathode active material above is used for the cathode of the battery decreases, and the reaction resistance of the cathode also increases. In order to further reduce the reaction resistance, preferably the surplus amount u of Lithium is 0.10 or greater and 0.35 or less.

As expressed in the general formula above, the cathode active material of the present invention is preferably adjusted so that the lithium nickel manganese composite oxide particles contain added element(s) M. By containing element(s) M above, it is possible to improve the durability, and output characteristics of a battery that uses this cathode active material.

Particularly, by uniformly distributing the added element on the surface or inside the particles, it is possible to obtain the above effect of all particles, and together with obtaining the effect above by adding a small amount, it is possible to suppress a decrease in capacity.

Furthermore, in order to obtain the effect by adding an even smaller amount, preferably the concentration of added element on the surface is higher than that inside the particles.

When the atomic ratio y of the added element(s) M with respect to all atoms exceeds 0.05, the metal elements that contribute to the Redox reaction decrease, so the battery capacity decreases, which is not preferred. Therefore, the added element(s) M is adjusted so that the atomic ratio y is within the range above.

(Average Particle Size)

Figure 7:
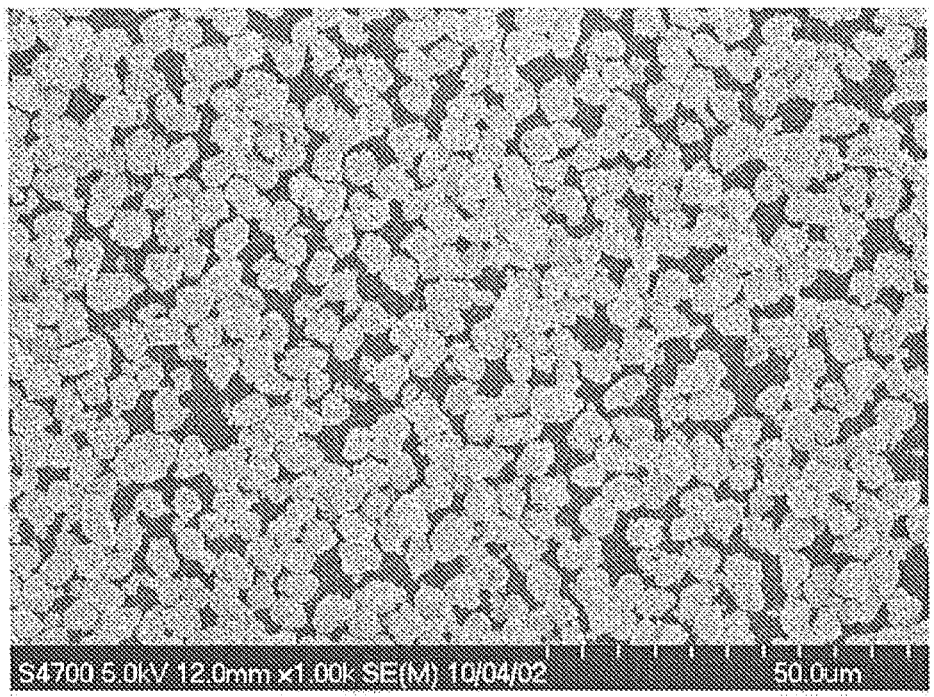
FIG. 7 is an SEM photograph of the lithium nickel manganese composite oxide, which is a cathode active material, of the present invention (with 1,000 magnification).

As illustrated in FIG. 7, the cathode active material of the present invention has an average particle size of 2 to 8 μm. When the average particle size is less than 2 μm, the packing density of particles when the cathode is formed decreases, and the battery capacity per volume of the cathode decreases. On the other hand, if the average particle size exceeds 8 μm, the specific surface area of the cathode active material decreases lowering the interface between the cathode active material and the electrolyte of the battery. As a result, the resistance of the cathode increases and the output characteristic of the battery decreases.

Therefore, by adjusting the cathode active material so that the average particle size becomes 2 to 8 μm, preferably 3 to 8 μm, further preferably 3 to 6.5 μm, it is possible to increase the battery capacity per volume of the battery that uses this cathode active material for the cathode, and it is possible to obtain excellent battery characteristics such as safety and high output.

(Particle Size Distribution)

As illustrated in FIG. 7, for the cathode active material comprises highly homogeneous lithium nickel manganese composite oxide secondary particles having an index [(d90−d10)/average particle size] that indicates the size of the particle size distribution of 0.60 or less and preferably 0.55 or less.

When particle size distribution is wide, there are many fine particles having a particle size that is very small with respect to the average particle size, or coarse particles having a particle size that is very large with respect to the average particle size. When the cathode is formed using a cathode active material having many fine particles, there is a possibility that heat will be generated due to localized reaction of the fine particles, and together with a decrease in safety, fine particles selectively deteriorate, causing the cyclability to become poor. On the other hand, when the cathode is formed using cathode active material having many coarse particles, there is not sufficient reaction area for the electrolyte and cathode active material, and thus the battery output decreases due to an increase in reaction resistance.

Therefore, by making the index [(d90−d10)/average particle size] described above 0.60 or less with regard to the particle size distribution of the cathode active material, it is possible to reduce the ratio of fine particles or coarse particles in the cathode active material, and a battery that uses this cathode active material for the cathode is very safe, and has good cyclability and battery output characteristics. The average particle size, d90 and d10 are the same as those used for the composite hydroxide particles, and measurement is performed in the same way.

(Particle Structure)

Figure 8:
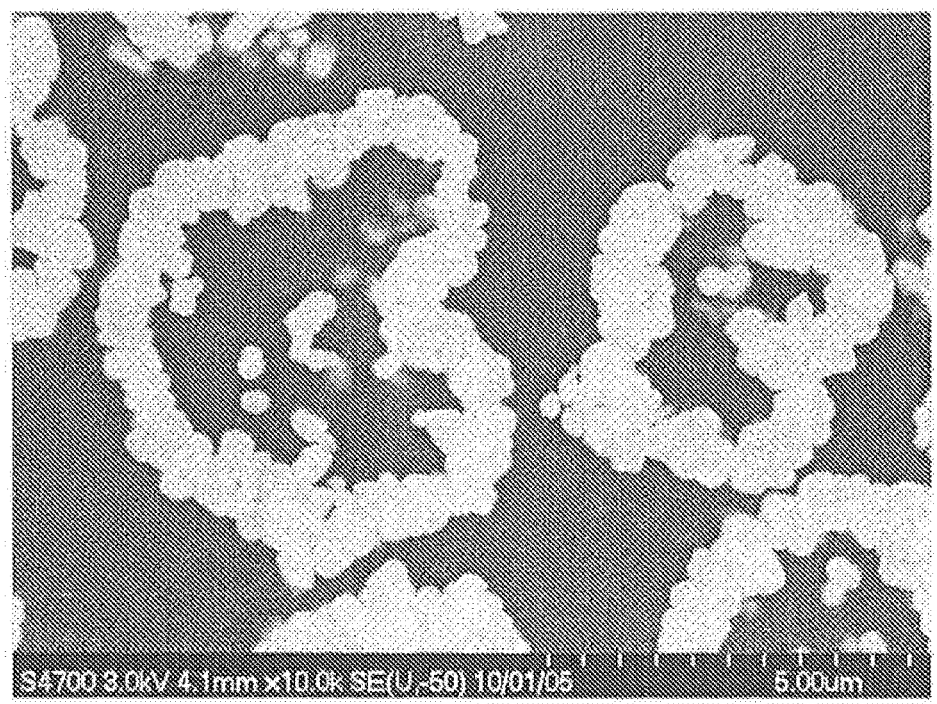
FIG. 8 is an SEM photograph of a cross section of the lithium nickel manganese composite oxide, which is a cathode active material, of the present invention (with 10,000 magnification).

As illustrated in FIG. 8, a feature of the cathode active material of the present invention is the hollow structure comprising a hollow section inside the secondary particles and an outer shell section on the outside. By having this kind of hollow structure, it is possible to increase the reaction area, and electrolyte enter inside from the particle boundaries or gaps between the primary particles of the outer shell section, and lithium is inserted and removed at the reactive interface on the surface of the primary particles on the hollow section side inside the particles as well, so mobility of Li ions and electrons is not hindered, and it is possible to increase the output characteristic.

Here, preferably the ratio of the thickness of the outer shell section with respect to the particle size of the lithium nickel manganese composite oxide particles is 5 to 45% and more preferably, 8 to 38%. Moreover, preferably the absolute value is within the range 0.5 to 2.5 µm, and it is particularly preferred that the range be 0.4 to 2.0 µm. When the ratio of the thickness of the outer shell section with respect to the particle size is less than 5%, the strength of the lithium nickel manganese composite oxide particles decreases, so handling the powder, and when used in a battery cathode, the particles break down and become fine particles, making the characteristics poor. On the other hand, when the ratio of the thickness of the outer shell section with respect to the particle size exceeds 45%, only a small amount of electrolyte enters inside the hollow section inside the particles from the particle boundaries and spaces, and the surface area that contributes to the battery reaction becomes smaller, so the cathode resistance increases and the output characteristic decreases. The ratio of the thickness of the outer shell section with respect to the lithium nickel manganese composite oxide particle size can be found in the same way as for the composite hydroxide particles.

(Characteristics)

When the cathode active material above is used for example in the cathode of a 2032 type coin battery, when cobalt is not added, high initial discharge capacity of 200 mAh/g or greater is obtained, and even when cobalt is added at an atomic ratio of 30% of the entire metallic elements other than lithium, a high initial discharge capacity of 150 mAh/g is obtained, and low cathode resistance and high cycle capacity retention is obtained, which are excellent characteristics for a cathode active material for a non-aqueous electrolyte secondary battery.

(2-2) Method for Manufacturing Cathode Active Material for a Non-Aqueous Electrolyte Secondary Battery As long as the method for manufacturing the cathode active material of the present invention is such that the cathode active material has the average particle size, particle size distribution and particle structure above, the method is not particularly limited, however, by employing the method below the cathode active material can surely be manufactured, so is preferred.

Figure 3:
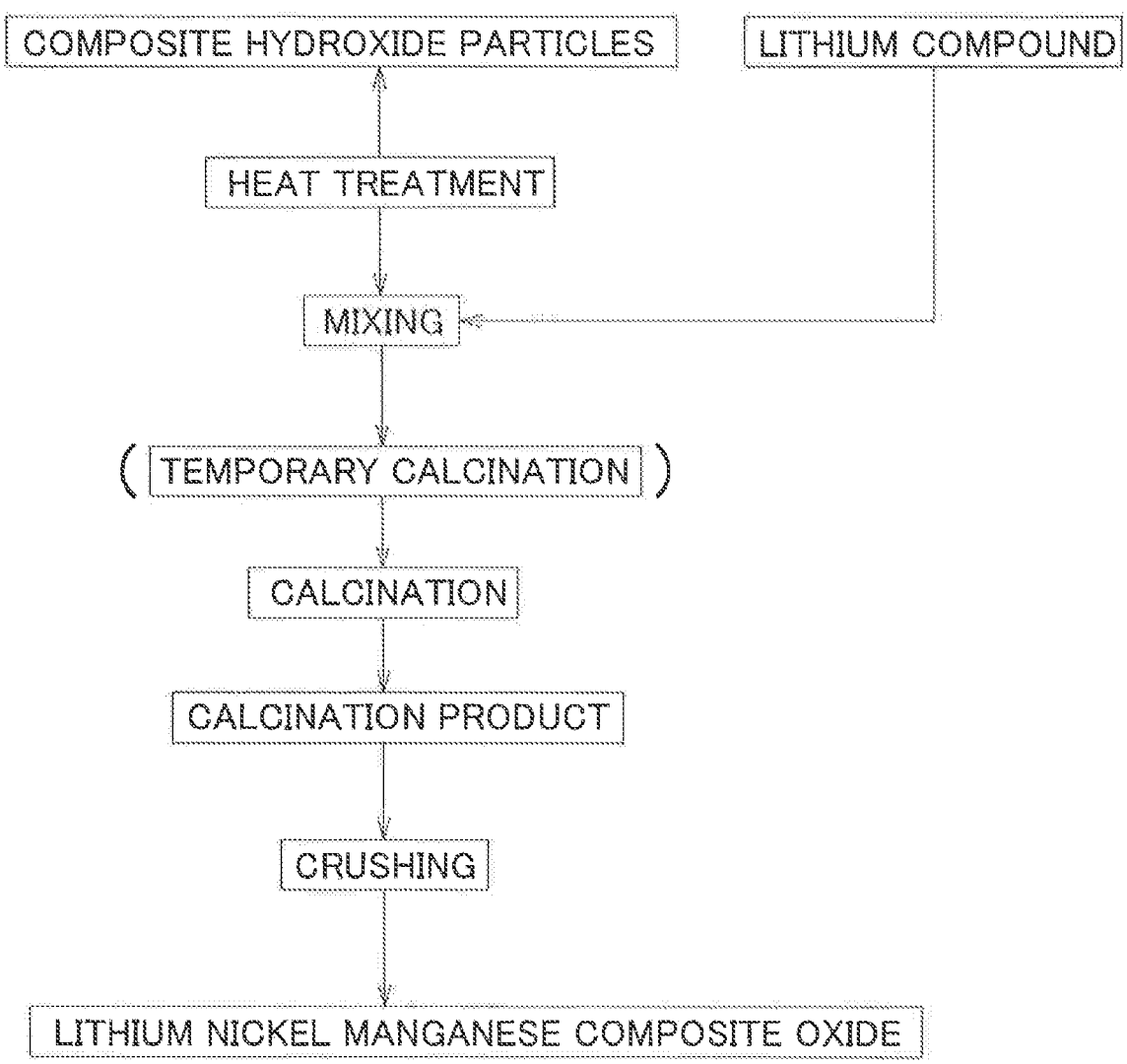
FIG. 3 is a flowchart of a process for manufacturing a lithium nickel manganese composite oxide, which is a cathode active material, from the nickel manganese composite hydroxide of the present invention.
Figure 4:
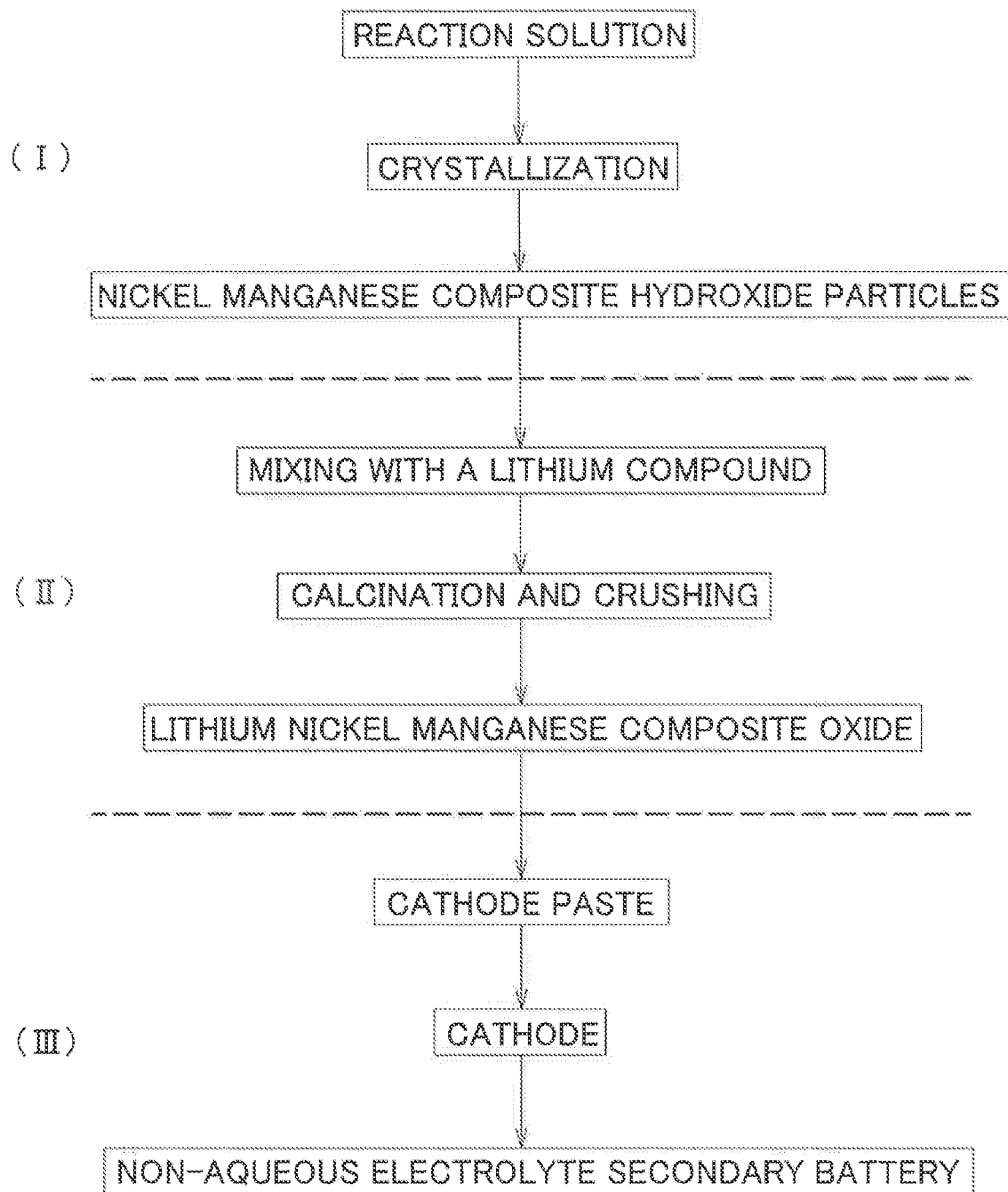
FIG. 4 is a flowchart of the flow from manufacturing the nickel manganese composite hydroxide to manufacturing a non-aqueous electrolyte secondary battery.

As illustrated in FIG. 3, the method for manufacturing cathode active material of the present invention includes: a) a step of heat treating the nickel manganese composite hydroxide particles that are the raw material for the cathode active material of the present invention; b) a mixing step for forming a mixture by mixing a lithium compound into the particles after heat treatment; and c) a calcination step of calcining the mixture that was formed in the mixing step. Each of the steps will be explained below.

a) Heat Treatment Step

The heat treatment step is a step for performing heat treatment that heats the nickel manganese composite hydroxide particles (hereafter, referred to as composite hydroxide particles) to a temperature of 105 to 750° C., and removes the moisture contained in the composite hydroxide particles. By performing this heat treatment step, moisture that remains in the particles up to the calcination step can be reduced to a fixed amount. As a result, it is possible to prevent fluctuation in the percentage of the number of metal atoms or the number of lithium atoms in the manufactured cathode active material.

Moisture should be removed to an amount such that fluctuation in the percentage of the number of metal atoms or the number of lithium atoms in the manufactured cathode active material does not occur, so it is not absolutely necessary to convert all of the composite hydroxide particles to nickel manganese composite oxide particles (hereafter, referred to as composite oxide particles). However, in order to further reduce the fluctuation described above, preferably the heating temperature is 500° C. or greater, and all of the composite hydroxide particles are converted to composite oxide particles.

In the heat treatment step, when the heating temperature is less the 105° C., it is not possible to remove the surplus moisture in the composite hydroxide particles, and it is not possible to suppress the fluctuation above. On the other hand, when the heating temperature exceeds 750° C., the particles are sintered by the heat treatment, and it is not possible to obtain composite oxide particles having a uniform particle size. The metallic component that is included in the composite hydroxide particles is analyzed according to the heat treatment conditions and found beforehand, and by determining a ratio with the lithium compound, it is also possible to suppress the fluctuation.

The atmosphere for performing heat treatment is not particularly limited, and can be a non-reducing atmosphere, however, preferably heat treatment is performed in an air-flow of normal atmosphere which can be performed easily.

Moreover, the heat treatment time is not particularly limited, however, when the time is less than one hour, the removal of surplus moisture in the composite hydroxide particles cannot be performed sufficiently, so preferably the time is one hour or longer, and more preferably 5 to 15 hours.

The equipment that is used in the heat treatment is not particularly limited, and as the composite hydroxide particles can be heated in a non-reducing atmosphere, or preferably in an airflow of normal atmosphere, an electric furnace that does generate gas can suitably be used.

b) Mixing Step

The mixing step is a step for obtaining a lithium mixture by mixing the composite hydroxide particles that were heat treated in the heat treatment step (hereafter, referred to as heat treated particles) with a material containing lithium, for example a lithium compound.

Here, not only the composite hydroxide particles from which residual moisture was removed in the heat treatment step, but also complex oxide particles that were converted to oxides in the heat treatment step or a mixture of these particles is contained in the heat treated particles.

The heat treated particles and the lithium compounds are mixed so that the ratio of the number of lithium atoms with respect to the number of metal atoms other than lithium in the lithium mixture, in other words, the sum of the atoms of nickel, manganese, cobalt and added elements (Me) (Li/Me) is 0.95 to 1.5, and preferably 1 to 1.5, and more preferably 1.1 to 1.35. In other words, the ratio Li/Me does not change before and after the calcination step, so the ratio Li/Me in the mixing step become the ratio Li/Me in the cathode active material, so mixing is performed so that the ratio Li/Me of the lithium compound is the same as the ratio Li/Me in the cathode active material to be obtained.

The lithium compound that is used for forming the lithium mixture is not particularly limited, however, for example, from the aspect of the ease of obtaining material, lithium hydroxide, lithium sulfate, lithium carbonate or a mixture of these is preferred. Particularly, taking into consideration the ease of handling and the stability of quality, preferably lithium hydroxide or lithium carbonate is used.

Preferably the lithium mixture is sufficiently mixed before calcination. When mixing is not sufficient, there is a possibility that problems will occur such as fluctuation in Li/Me between individual particles, and sufficient battery characteristics will not be obtained.

Furthermore, a typical mixer can be used for mixing; for example, it is possible to use a shaker mixer, Lodige mixer, Julia mixer, V blender or the like, and the composite oxide particles should be sufficiently mixed with material containing lithium to an extent that the framework of the heat treated particles is not broken down.

c) Calcination Step

The calcination step is a step that caclinates the lithium mixture that was obtained in the mixing step, and forms a lithium nickel manganese composite oxide. When the lithium compound is calcinated in the calcination step, the lithium in a lithium containing material is dispersed in the heat treated particles, so a lithium nickel manganese composite oxide is formed.

(Calcination Temperature)

The calcination of the lithium mixture is preferably performed at a temperature of 800 to 980° C., and more preferably 820 to 960° C.

When the calcination temperature is less than 800° C., dispersion of lithium into the heat treated particles is not performed sufficiently, and surplus lithium or unreacted particles remain, the crystal structure is not sufficiently arranged, and when used in a battery, sufficient battery characteristics are not obtained.

Moreover, when the calcination temperature exceeds 980° C., there is a possibility that together with severe sintering occurring between composite oxide particles, there will be abnormal particle growth, so there is a possibility that the particles after calcination will become coarse, and it will not be possible to maintain the particle shape (spherical particles shape to be described next). In the case of this kind of cathode active material, the specific surface area decreases, so when used in a battery, there is a problem in that the cathode resistance increases and the battery capacity decreases.

From the aspect of uniformly performing the reaction between the heat treated particles ad the lithium compound, preferably the temperature above will rise at a temperature increase rate of 3 to 10° C./min. Furthermore, by maintaining the temperature at near the melting point of the lithium compound for 1 to 5 hours, it is possible to perform an even more uniform reaction.

(Calcination Time)

Of the calcination time, the hold time, during which the temperature is maintained at a specified temperature, is preferably at least 2 hours, and more preferably 4 to 24 hours. When the time is less than 2 hours, it is possible that the formation of the lithium nickel manganese composite oxide will not be performed sufficiently. After this hold time is finished, the time is not particularly limited, however, when the lithium mixture is accumulated in a sagger and calcinated, in order to prevent deterioration of the sagger, preferably the atmosphere is cooled to 200° C. at a cooling rate of 2 to 10° C./min.

(Temporary Calcination)

Particularly, when lithium hydroxide or lithium carbonate is used as the lithium compound, temporary calcination is performed by maintaining the temperature at a temperature of 350 to 800° C., which is lower than the calcination temperature, and preferably at a temperature of 450 to 780° C. for 1 to 10 hours, and preferably 3 to 6 hours. In other words, preferably temporary calcination is performed at the reaction temperature of the lithium hydroxide or lithium carbonate and the heat treated particles. In this case, by maintaining the temperature at near the reaction temperature of the lithium hydroxide or lithium carbonate, it is possible to sufficiently perform dispersion of the lithium into the heat treated particles, and thus it is possible to obtain uniform lithium nickel manganese composite oxide.

When it is desired to increase the concentration of added element M on the surface of the lithium nickel manganese composite oxide particles, heat treated particles of the raw material, the surface of which are uniformly coated by the added element M, can be used. By calcining a lithium mixture that contains the heat treated particles under moderate conditions, it is possible to increase the concentration of the added element M on the surface of the lithium nickel manganese composite oxide particles. More specifically, by calcining a lithium mixture that contains heat treated particles coated by the added element M at a temperature lower than the calcination temperature and for a time shorter than the calcination time, it is possible to obtain lithium nickel manganese composite particles having an increased concentration of added element M on the surface of the particles.

Even when a lithium mixture containing heat treated particles coated with the added element M is calcinated, when the calcination temperature is high and the calcination time is long, it is possible to obtain lithium nickel manganese composite oxide particles in which the added element is uniformly distributed inside the particles. In other words, by adjusting the heat treated particles of the raw material and the calcination conditions, it is possible to obtain lithium nickel manganese composite oxide particles having the target concentration distribution.

(Calcination Atmosphere)

The calcination atmosphere is preferably an oxidizing atmosphere, and more preferably the oxygen concentration is 18 to 100% by volume, and a mixed atmosphere of oxygen having the oxygen concentration described above and an inert gas is particularly preferred. In other words, preferably calcination is performed in atmospheric air or in an oxygen flow. When the oxygen concentration is less than 18% by volume, there is a possibility that the crystallinity of the lithium nickel manganese composite oxide will not be sufficient. Particularly, when considering the battery characteristics, performing calcination in oxygen flow is preferred.

The furnace that is used in calcination is not particularly limited, and as long as the lithium mixture can be heated in atmospheric air or in oxygen flow, any kind of furnace can be used, however, from the aspect of uniformly maintaining the atmosphere inside the furnace, an electric furnace in which gas is not generated is preferred, and it is possible to use either a batch type or continuous type of furnace.

(Cracking)

Of the lithium nickel manganese composite oxide particles obtained by calcination, aggregation or light sintering may occur. In that case, the particles must be cracked, and as a result, lithium nickel manganese oxide, or in other words, the cathode active material of the present invention can be obtained. Cracking is an operation for loosening up an aggregate wherein mechanical energy is applied to an aggregate of a plurality of secondary particles resulting from sintering necking between secondary particles during calcination in order to separate the secondary particles without breaking down the secondary particles themselves.

(3) Non-Aqueous Electrolyte Secondary Battery

The non-aqueous electrolyte secondary battery of the present invention employs a cathode that uses the cathode active material for a non-aqueous electrolyte secondary battery for the cathode. First, the construction of the non-aqueous electrolyte secondary battery of the present invention will be explained.

Except for using cathode active material of the present invention, the construction of the non-aqueous electrolyte secondary battery of the present invention essentially comprises the same construction as a typical non-aqueous electrolyte secondary battery.

More specifically, the secondary battery of the present invention comprises a case, a cathode and anode that are housed in the case, a non-aqueous electrolyte and a separator. Even more specifically, an electrode unit that is obtained by layering a cathode and anode with a separator in between is impregnated with a non-aqueous electrolyte, and collector leads are used to connect between the cathode current collector of the cathode and the cathode terminal that leads to the outside, and between the anode current collector of the anode and the anode terminal that leads to the outside, and these are sealed in the case to form the secondary battery of the present invention.

The construction of the secondary battery of the present invention, needless to say, is not limited to the example above, and various shapes can be used for the external shape such as a can shape, layered shape or the like.

(Cathode)

First, the cathode, which is the feature of the secondary battery of the present invention, is explained. The cathode is a sheet shaped member, and is formed, for example, by coating and drying a cathode compound paste that contains the cathode active material of the present invention on the surface of an aluminum foil collector.

The cathode is appropriately processed to correspond to the type of battery used. For example, processing such as a cutting process to form a suitable size for the battery, a compression process such as roll pressing or the like to increase the electrode density and the like is performed.

The cathode compound paste is formed by adding a solvent to the cathode compound and mixing. The cathode compound is a mixing the powder cathode active material of the present invention with a conductive material and a binding agent.

The conductive material is added for giving suitable conductivity to the electrode. This conductive material is not particularly limited, for example, a carbon black material such as graphite (natural graphite, synthetic graphite, expanded graphite), acetylene black, Ketchen black and the like can be used.

The binding agent serves the role of binding cathode active material particles. The binding agent that is used in this cathode compound is not particularly limited, however, it is possible to use, for example, polyvinylidene fluoride (PVDF), polytetrafluoroethylene (PTFE), fluororubber, ethylene-propylene-diene rubber, styrene-butadiene, cellulose resin, polyacrylic acid or the like.

It is also possible to add activated carbon to the cathode material, and by added activated carbon, it is possible to increase the electric double layer capacitance of the cathode.

The solvent dissolves the bonding agent, and causes the cathode active material, conductive material and activated carbon to be dispersed into the bonding agent. This solvent is not particularly limited, however, it is possible to use an organic solvent such as N-methyl-2-pyrrolidone for example.

The mixture ratio of the material inside the cathode compound paste is not particularly limited. For example, when the solid content of the cathode compound without the solvent is taken to be 100 parts by weight, then as in the case of a cathode in a typical non-aqueous electrolyte secondary battery, the content of the cathode active material can be 60 to 95 parts by weight, the content of the conductive material can be 1 to 20 parts by weight, and the content of the binding agent can be 1 to 20 parts by weight.

(Anode)

The anode is a sheet shaped member that is formed by coating and drying anode compound paste on the surface of a metal foil collector made of metal such as copper. This anode is formed essentially by the same method as the cathode, however the components of the anode compound paste, the composition of those components, and the material of the collector differ, and as in the case of the cathode, various processing is performed as necessary.

The anode compound paste is formed by adding a suitable solvent to the anode compound, which is a mixture of anode active material and a binding agent, to obtain a paste.

The anode active material, for example, can be a material containing lithium such as metallic lithium or lithium alloy, or can be an absorbing material that is capable of absorption and desorption of lithium ions.

The absorbing material is not particularly limited, and it is possible to use an organic compound fired material such as natural graphite, synthetic graphite, phenol resin and the like, or a powder like carbon material such as coke. When this absorbing material is used for the anode active material, as in the case of the cathode, it is possible to use a fluorine-containing resin such as PVDF as the binding agent, and it is possible to use an organic solvent such as N-methyl-2-pyrrolidone as the solvent that disperses the anode active material into the binding agent.

(Separator)

The separator is located between the cathode and the anode, and functions to separate the cathode and anode and to hold the electrolyte. The separator is made from a thin polyethylene or polypropylene film, for example, it is possible to use a film having a plurality of fine holes, however, as long as the separator has the functions described above, it is not particularly limited.

(Non-Aqueous Electrolyte)

The non-aqueous electrolyte is formed by dissolving a lithium salt, which is the supporting electrolyte, in an organic solvent.

The organic solvent can be selected from one kind or a mixture of two or more kinds of a cyclic carbonate such as ethylene carbonate, propylene carbonate, butylene carbonate, trifluoropropylene carbonate or the like; a chain carbonate such as diethyl carbonate, dimethyl carbonate, ethyl methyl carbonate, dipropyl carbonate and the like, an ether compound such as tetrahydrofuran, 2-methyltetrahydrofuran, dimethoxyethane and the like; a sulfur compound such as ethyl methyl sulfone, butane sultone and the like; or a phosphorus compound such as triethyl phosphate, trioctyl phosphate and the like.

As the supporting electrolyte, it is possible to use a salt such as $LiPF_6$, $LiBF_4$, $LiClO_4$, $LiAsF_6$, $LiN(CF_3SO_2)_2$ or a combination of these.

In order to improve the battery characteristics, the non-aqueous electrolyte can also include a radical scavenger, a surfactant, a flame retardant and the like.

(Characteristics of the Non-Aqueous Electrolyte Secondary Battery of the Present Invention)

The non-aqueous electrolyte secondary battery of the present invention is constructed as described above, and has a cathode that uses the cathode active material of the present invention, so a high initial discharge capacity and a low cathode resistance are obtained, and the battery is a high capacity and high output battery. Moreover, when compared with conventional lithium nickel oxide cathode active material, can be said to have high thermal stability and good safety characteristics.

(Uses of the Secondary Battery of the Present Invention)

The secondary battery of the present invention has the above characteristics, so it is suitable for use as a power source for a compact portable device that requires constant high capacity (such as a notebook personal computer, mobile telephone or the like).

Moreover, the secondary battery of the present invention is also suitable for use as battery as the power source for driving a motor that requires high output. As a battery becomes large, it becomes difficult to maintain safety, and expensive protective circuits are essential, however, the secondary battery of the present invention has excellent safety, so not only is it easy to maintain safety, it is possible to simplify expensive protective circuits, and further lower the cost. The battery can be made to be compact and have high output, so is suitable as a power source for conveying equipment that is restricted by installation space.

EXAMPLES

Example 1

[Manufacturing of the Composite Hydroxide Particles]

The composite hydroxide particles were manufactured as described below. For all examples, the composite hydroxide particles, cathode active material and secondary battery were manufactured using special grade chemicals manufactured by Wako Pure Chemical Industries, Ltd.

(Nucleation Step)

First, water was put into the reaction tank (34 L) until half full while mixing, the temperature inside the tank is set to 40° C. The inside of the tank was air atmosphere (oxygen concentration: 21% by volume). An appropriate amount of 25% by volume sodium hydroxide aqueous solution and 25% by volume of ammonia water were added to the water in the reaction tank, and the pH value of the aqueous solution in the reaction tank was adjusted to a value of 13.0 at a standard solution temperature of 25° C. Furthermore, the ammonia concentration in the reaction solution was adjusted to be 15 g/L, to obtain the aqueous solution before reaction.

Next, nickel sulfate and manganese sulfate was dissolved in the water to prepare a 1.8 mol/L mixed solution. The mixed solution was adjusted so that the elemental mole ratio of each metal is Ni:Mn=50:50.

This mixed solution was added at a rate of 88 ml/min to the aqueous solution before reaction in the reaction tank to form a reaction solution. At the same time, 25% by volume of ammonia water and 25% by volume sodium hydroxide aqueous solution were also added at a constant rate to the reaction solution, and with the ammonia concentration in the reaction aqueous solution (aqueous solution for nucleation) constant, control was performed to keep the pH value at 13.0 (nucleation pH value), nucleation was performed for 2 minutes 30 seconds.

(Particle Growth Step)

After nucleation ended, only the supply of 25% by volume of sodium hydroxide solution was stopped until the pH value of the reaction solution reached a value of 11.6 at a standard solution temperature of 25° C.

After the pH value of the reaction solution reached 11.6, the 25% by volume sodium hydroxide aqueous solution was once again supplied to the reaction solution (aqueous solution for particle growth), and while keeping the ammonia concentration at the value above and performing control to keep that pH value at 11.6 at a standard solution temperature of 25° C., crystallization and particle growth were performed for 30 minutes, after which the supply of solution was temporarily stopped, and nitrogen gas was caused to flow at 5 L/min until the oxygen concentration in the space in the reaction tank become 0.2% by volume or less. After that, the supply of solution was restarted, and from the beginning of particle growth, crystallization was performed for 2 hours.

When the reaction tank became full, crystallization was stopped, and by stopping mixing and letting the solution sit, deposition of the product was promoted. After that, after half of the supernatant liquid was removed from the reaction tank, crystallization was restarted, and after performing crystallization for 2 hours (total of 4 hours), crystallization was stopped.

The grown material was then washed, filtered and dried to obtain composite hydroxide particles. Switching from an air atmosphere to a nitrogen atmosphere was performed after the start of the particle growth process when the time was 12.5% of the total time of particle growth process.

During the crystallization above, the pH was controlled using a pH controller to adjust the supply flow rate of sodium hydroxide aqueous solution, and the range of fluctuation was within the range of ±0.2 of the set value.

[Analysis of the Composite Hydroxide]

For the obtained composite hydroxide, after a sample was dissolved in an inorganic acid, chemical analysis was performed by using ICP-Atomic Emission Spectrometry, and the composition was found to be $Ni_{0.5}Mn_{0.5}(OH)_{2+a}$ ($0 \leq a \leq 0.5$).

Moreover, for this composite hydroxide, the value [(d90−d10)/average particle size] that indicates the average particle size and particles size distribution is calculated and found from the volume integrated value that was measured using a laser diffraction scattering particle size distribution measurement device (Microtrac HRA, manufactured by Nikkiso Co., Ltd.). As a result, the average particle size was found to be 5.3 μm, and the value [(d90−d10)/average particle size] was 0.49.

Next, SEM (scanning electron microscope S-4700, manufactured by Hitachi High-Technologies Corporation) observation (magnification rate: 1000×) of the obtained composite hydroxide particles was performed, and it was confirmed that the composite hydroxide particles were spherical, and the particle size was nearly uniform. The SEM observation results are illustrated in FIG. 5.

A sample of the obtained composite hydroxide particles was embedded in resin, and after performing a cross-section polishing process, SEM observation was performed at a magnification rate of 10,000×, and as a result it was found that the composite hydroxide particles comprise secondary particles, and those secondary particles were composed of a center section having needle shape and flake shaped fine primary particles (a particle size of approximately 0.03 μm), and an outer shell section on the outside of the center section having plate shaped primary particles that are larger than the fine primary particles (a particle size of approximately 0.6 μm) were observed. The results of the SEM observation of this cross section are illustrated in FIG. 6. The thickness of the outer shell section with respect to the diameter of the secondary particles was found to be 11% from the SEM observation of this cross section.

[Manufacturing the Cathode Active Material]

The composite hydroxide particles were heat treated in air (oxygen: 21% by volume) at a temperature of 700° C. for 6 hours, converted to composite oxide particles and recovered.

Lithium hydroxide was weighed so that Li/Me=1.35, and then mixed with the composite oxide particles above to prepare a lithium mixture. Mixing was performed using a shaker mixer (TURBULA Type T2C, manufactured by Willy A. Bachofen AG (WAB)).

The obtained lithium mixture was temporarily calcinated in an air atmosphere (oxygen: 21% by volume) at a temperature of 500° C. for 4 hours, then calcinated at 900° C. for 4 hours, cooled, and then crushed to obtain the cathode active material.

[Analysis of the Cathode Active Material]

Using the same method as for the composite hydroxide particles, the particle size distribution of the obtained cathode active material was measured, and the average particle size was 4.8 μm, and the value [(d90−d10)/average particle size] was 0.49.

Using the same method as for the composite hydroxide particles, the SEM observation and cross-section SEM observation of the cathode active material were performed, and it was confirmed that the obtained cathode active material was spherical and the particle size was mostly uniform. The results of the SEM observation of this cathode active material is illustrated in FIG. 7. On the other hand, it was also confirmed from the cross-section SEM observation that this cathode active material has hollow construction comprising an outer shell section of sintered primary particles, and a hollow section inside the shell section. The results of the cross-section SEM observation of this cathode active material are illustrated in FIG. 8. The ratio of the thickness of the outer shell section with respect to the particle size of the cathode active material was 12%.

The specific surface area of the obtained cathode active material was found using a flow type gas adsorption specific surface area measurement device (Multisorb, manufactured by Yuasa-Ionics Co., Ltd.) to be 1.5 $m^2/g$.

Moreover, analysis by Cu—Kα line powder X-ray diffraction was performed for the obtained cathode active material using an X-ray diffractometer (X'Pert PRO, manufactured by PANalytical), and the crystal structure of the cathode active material was confirmed to comprise a single-phase hexagonal layered crystal lithium nickel manganese composite oxide.

Furthermore, similarly, using the ICP-Atomic Emission Spectrometry method, the composition of the cathode active material was analyzed, and confirmed to be $Li_{1.36}Ni_{0.50}Mn_{0.50}O_2$ with a composition of Li at 9.55% by weight, Ni at 29.7% by weight and Mn at 27.8% by weight.

[Manufacturing the Secondary Battery]

Figure 9:
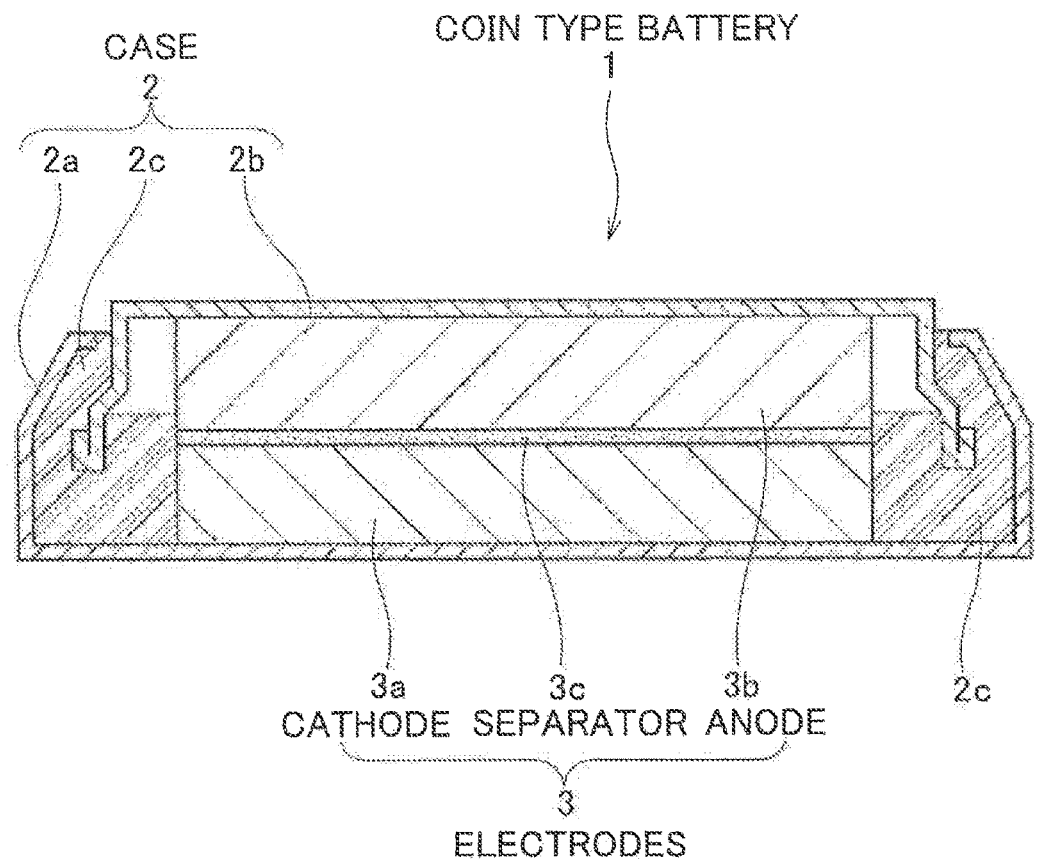
FIG. 9 is a cross-sectional view of a coin-type battery that was used for battery evaluation.

For evaluation of the obtained cathode active material, the cathode active material was used in 2032 type coin battery. As illustrated in FIG. 9, this coin type battery 1 comprises a case 2, and electrodes 3 that are housed inside the case 2.

The case 2 has a cathode can 2a that is hollow and opened on one end, and an anode can 2b that is placed at the opening section of the cathode can 2a, and when this anode can 2b is placed at the opening section of the cathode can 2a, a space is formed that houses electrodes 3 between the anode can 2 and cathode can 2a.

The electrodes 3 comprise a cathode 3a, separator 3c and anode 3b, which are layered in this order, and are housed in the case 2 such that the cathode 3a comes in contact with the inner surface of the cathode can 2a, and the anode 3b comes in contact with the inner surface of the anode can 2b.

The case 2 comprises a gasket 2c, and this gasket 2c fastens the cathode can 2a and anode can 2b so that an electrically insulated state is maintained between the cathode can 2a and anode can 2b. Moreover, the gasket 2c also has the function of sealing off the space between the cathode can 2a and anode can 2b and closing off the space between the inside of the case 2 and the outside so that the space is airtight and fluid tight.

This coin type battery 1 is manufactured as described below. First, 52.5 mg of the obtained cathode active material, 15 mg of acetylene black, and 7.5 mg of polytetrafluoroethylene resin (PTFE) are mixed, and then the cathode 3a is manufactured by pressing the mixture with a pressure of 100 MPa, to a diameter of 11 mm and thickness of 100 μm. The manufactured cathode 3a is dried in a vacuum drier at 120° C. for 12 hours. Using this cathode 3a, an anode 3b, a separator 3c and electrolyte, the coin type battery 1 is manufactured inside a glove box having an Ar atmosphere having a dew point controlled at −80° C.

An anode sheet that is formed by coating copper foil with graphite powder having an average particle size of 20 μm and polyvinylidene fluoride and that is punched into a disk shape having a diameter of 14 mm is used as the anode 3b. A porous polyethylene film having a film thickness of 25 μm is used as the separator 3c. A mixed solution (manufactured by Tomiyama Pure Chemical Industries, Ltd.) of equal amounts of ethylene carbonate (EC) and diethyl carbonate (DEC) with 1M of $LiClO_4$ as the supporting electrolyte is used as the electrolyte.

[Battery Evaluation]

The initial discharge capacity, the cycle capacity retention rate and the cathode resistance, which are used to evaluate the performance of the obtained coin type battery 1, are defined in the following The initial discharge capacity is the capacity after the coin type battery 1 is allowed to sit for 24 hours after being manufactured and the open circuit voltage (OCV) has become stable, is charged to a cutoff voltage of 4.8 V with the current density with respect to the cathode being 0.1 mA/cm$^2$, then after stopping for one hour, is discharged to a cutoff voltage of 2.5 V.

The cycle capacity retention rate is the calculated ratio of the discharge capacity after the charging/discharging cycle of charging to 4.5 V and discharging to 3.0 V has been performed 200 times, with the current density with respect to the cathode being 2 mA/cm$^2$, and the initial discharge capacity. Measurement of the charge and discharge capacity is performed using a multi-channel voltage/current generator (R6741A, manufactured by Advantest Corporation).

Figure 10:
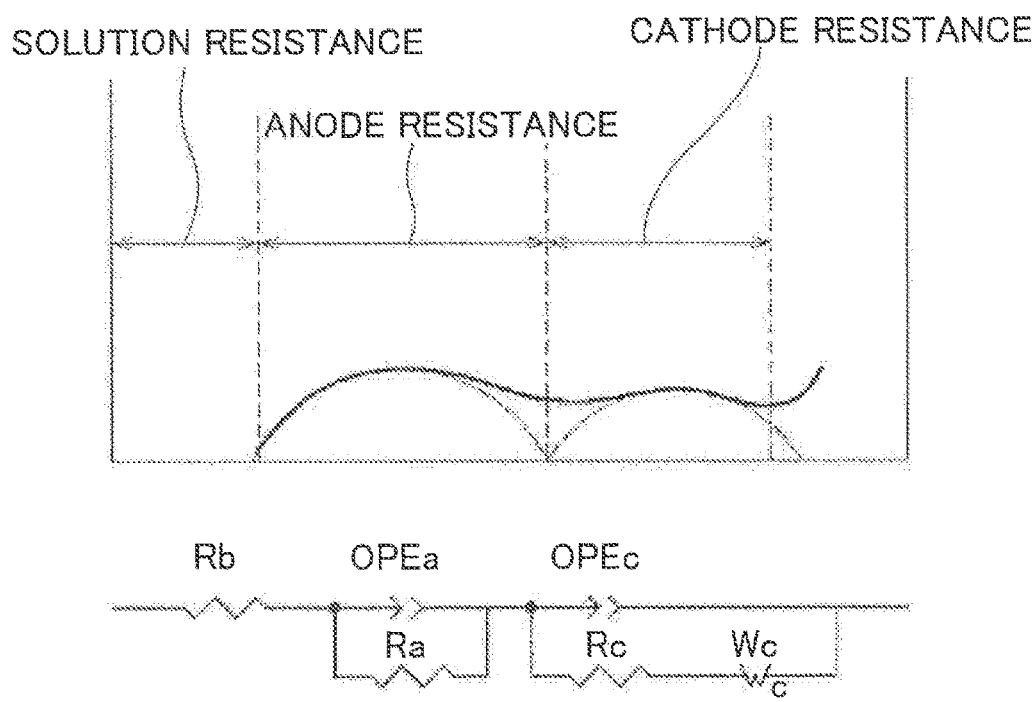
FIG. 10 is a drawing for describing an outline of an equivalent circuit that was used for measurement and analysis in impedance evaluation.

The cathode resistance is evaluated as described below. The coin type battery 1 is charged to a potential of 4.1 V, an then using a frequency response analyzer and a potentio/galvanostat (1255B, manufactured by Solartron), the cathode resistance is measured by the alternating current impedance method, and a Nyquist plot as illustrated in FIG. 10 is obtained. This Nyquist plot is represented as a sum of characteristic curves that indicate the solution resistance, anode resistance and capacity, and cathode resistance and capacity, so the value of the cathode resistance was calculated by performing a fitting calculation using an equivalent circuit based on this Nyquist plot.

In performing battery evaluation of the coin type battery having a cathode that was formed using the cathode active material above the initial charge capacity was 208.7 mAh/g, and the cathode resistance was 8.2Ω. The capacity retention rate was 85% after 200 cycles.

The characteristics of the composite hydroxide obtained in this example is illustrated in Table 1, and the characteristics of the cathode active material and the evaluations of a coin type battery that uses this cathode active material are illustrated in Table 2. The same contents for Examples 2 to 8 and Comparative Examples 1 to 5 below are also illustrated in Table 1 and Table 2.

Example 2

Except for mixing lithium hydroxide and composite oxide particles were mixed so that Li/Me=1.25, and using a calcination temperature of 850° C., cathode active material for a non-aqueous electrolyte secondary battery was obtained, and evaluation was performed in the same way as in Example 1. The composition of the obtained cathode active material was confirmed to be $Li_{1.25}Ni_{0.50}M_{0.50}O_2$, where Li was 8.84% by weight, Ni was 29.9% by weight and Mn was 28.0% by weight.

Example 3

Except for switching from an air atmosphere to a nitrogen atmosphere at timing that is 6.25% of the overall time of the particle growth process in the manufacturing process of composite hydroxide particles, cathode active material for a non-aqueous electrolyte secondary battery was obtained, and evaluation was performed in the same way as in Example 1. The composite hydroxide particles, as in Example 1, were composed of a center section that was made up of needle shaped fine primary particles (particle size is approximately 0.3 µm), and an outer shell section on the outside of the center section that was made up of plate shaped particles that are larger than the fine primary particles (particle size is approximately 0.7 µm).

Example 4

Except for dissolving sodium tungstate in addition to nickel sulfate and manganese sulfate in water to form a 1.8 mol/L mixed aqueous solution in the manufacturing process for composite hydroxide particles, cathode active material for a non-aqueous electrolyte secondary battery was obtained, and evaluation was performed in the same way as in Example 1. This mixed aqueous solution was adjusted so that element mole ratio of each metal became Ni Mn W=49.25:49.25:0.5. The composition of the obtained composite hydroxide was $Ni_{0.4925}Mn_{0.4925}W_{0.005}(OH)_{2+a}$ (0≤a≤0.5). The composition of the obtained cathode active material was confirmed to be $Li_{1.36}Ni_{0.4925}Mn_{0.4925}W_{0.005}O_2$, where Li was 9.54% by weight, Ni was 29.2% by weight, Mn was 27.0% by weight and W was 0.93% by weight.

Example 5

Except for dissolving zirconium sulfate in addition to nickel sulfate and manganese sulfate in water to form a 1.8 mol/L mixed aqueous solution in the manufacturing process for composite hydroxide particles, cathode active material for a non-aqueous electrolyte secondary battery was obtained, and evaluation was performed in the same way as in Example 1. This mixed aqueous solution was adjusted so that element mole ratio of each metal became Ni Mn W=49.25:49.25:0.5. The composition of the obtained composite hydroxide was $Ni_{0.4925}Mn_{0.4925}Zr_{0.005}(OH)_{2+a}$ (0≤a≤0.5). The composition of the obtained cathode active material was confirmed to be $Li_{1.36}Ni_{0.4925}Mn_{0.4925}Zr_{0.005}O_2$, where Li was 9.58% by weight, Ni was 29.3% by weight, Mn was 27.5% by weight and Zr was 0.46% by weight.

Example 6

Except for mixing lithium hydroxide with composite oxide particles so that Li/Me=1.10, cathode active material for a non-aqueous electrolyte secondary battery was obtained, and evaluation was performed in the same way as in Example 1. The composition of the obtained cathode active material was confirmed to be $Li_{1.10}Ni_{0.50}Mn_{0.50}O_2$, where Li was 7.86% by weight, Ni was 30.2% by weight and Mn was 28.3% by weight.

Example 7

Except for the temperature inside the tank of 50° C. and ammonia concentration of 20 g/L in the manufacturing process for composite hydroxide particles, cathode active material for a non-aqueous electrolyte secondary battery was obtained, and evaluation was performed in the same way as in Example 1. The composition of the obtained composite hydroxide and cathode active material were the same as in Example 1, and the composite hydroxide particles, as in Example 1, were composed of a center section that was made up of needle shaped fine primary particles (particle size is approximately 0.3 µm), and an outer shell section on the outside of the center section that was made up of plate shaped particles that are larger than the fine primary particles (particle size is approximately 0.7 μm).

Example 8

Except for switching from an air atmosphere to a nitrogen atmosphere at timing that is 25% of the overall time of the particle growth process in the manufacturing process of composite hydroxide particles, cathode active material for a non-aqueous electrolyte secondary battery was obtained, and evaluation was performed in the same way as in Example 1. The composite hydroxide particles, as in Example 1, were composed of a center section that was made up of needle shaped fine primary particles (particle size is approximately 0.3 μm), and an outer shell section on the outside of the center section that was made up of plate shaped particles that are larger than the fine primary particles (particle size is approximately 0.5 μm).

Comparative Example 1

Using a reaction tank for continuous crystallization that is equipped with an overflow pipe in the top, and while keeping the pH value of the reaction aqueous solution at a constant value of 11.0 at a standard solution temperature of 25° C. in an air atmosphere, mixed aqueous solution, ammonia aqueous solution and sodium hydroxide solution were continuously added at a constant flow rate, the overflowing slurry was continuously collected and crystallization was performed by a typical method. Except for the average residence time in the reaction tank being 10 hours, collecting the slurry after the tank was in a state of equilibrium, performing solid-liquid separation and obtaining crystallized matter, cathode active material for a non-aqueous electrolyte secondary battery was obtained, and evaluation was performed in the same way as in Example 1. The composition of the obtained composite hydroxide and cathode active material were the same as in Example 1. The overall composite hydroxide particles were composed of primary particles that were the same as in the outer shell section of Example 1, so the cathode active material was made up of minute particles having a solid structure.

Comparative Example 2

Except for the pH value during nucleation and particle growth being kept at a constant value of 11.6 at a standard solution temperature of 25° C., cathode active material for a non-aqueous electrolyte secondary battery was obtained, and evaluation was performed in the same way as in Example 1. During crystallization, nitrogen gas was caused to flow in the space of the reaction tank at a flow rate of 5 L/min, to keep the oxygen concentration at 0.2% by volume or less. The composition of the obtained composite hydroxide and cathode active material were the same as in Example 1. The overall composite hydroxide particles were composed of primary particles that were the same as in the outer shell section of Example 1, so the cathode active material was made up of minute particles having a solid structure.

Comparative Example 3

Except for the pH value during nucleation and particle growth being kept at a constant value of 12.6 at a standard solution temperature of 25° C., nickel manganese composite hydroxide was obtained in the same way as in Example 1. During crystallization, nitrogen gas was caused to flow in the space of the reaction tank at a flow rate of 5 L/min, to keep the oxygen concentration at 0.2% by volume or less. However, during the entire crystallization reaction, new nuclei were generated, so particle size distribution was wide, and the particles became unstructured with gel-like precipitate, which made separating solid and liquid difficult, so processing was stopped.

Comparative Example 4

Except for the calcination temperature being 1,000° C., cathode active material for a non-aqueous electrolyte secondary battery was obtained, and evaluation was performed in the same way as in Example 1. However, as a result of x-ray diffraction measurement, it was found that the hexagonal crystal structure broke down, and performance as a cathode active material could not be expected, so battery evaluation was not performed.

Comparative Example 5

Except for switching from an air atmosphere to a nitrogen atmosphere at timing that is 50% of the overall time of the particle growth process from the start of the particle growth process, cathode active material for a non-aqueous electrolyte secondary battery was obtained, and evaluation was performed in the same way as in Example 1. The thickness of the outer shell section of the composite hydroxide particles was insufficient, so in the calcination stage of the cathode active material, there was sintering of secondary particles, so the active material included rough large particles. The composition of the obtained composite hydroxide and cathode active material was the same as in Example 1.

TABLE 1

"Manufacturing Condition and Property of Composite Hydroxide Particles"

| | Added Elements M | Ammonia Concentration (g/L) | Temp. In Tank (° C.) | Nucleation pH | Particle Growth pH | Timing Of Switching of Atmosphere (%) | Average Particle Size (μm) | (d90 − d10)/ average particle size | Thickness of Outer Shell Section (%) |
|---|---|---|---|---|---|---|---|---|---|
| Ex. 1 | — | 15 | 40 | 13.0 | 11.6 | 12.5 | 5.3 | 0.49 | 11 |
| Ex. 2 | — | 15 | 40 | 13.0 | 11.6 | 12.5 | 5.3 | 0.49 | 11 |
| Ex. 3 | — | 15 | 40 | 13.0 | 11.6 | 6.25 | 4.9 | 0.48 | 13 |
| Ex. 4 | W | 15 | 40 | 13.0 | 11.6 | 12.5 | 5.0 | 0.48 | 10 |
| Ex. 5 | Zr | 15 | 40 | 13.0 | 11.6 | 12.5 | 5.1 | 0.49 | 10 |
| Ex. 6 | — | 15 | 40 | 13.0 | 11.6 | 12.5 | 5.3 | 0.49 | 10 |
| Ex. 7 | — | 20 | 50 | 13.0 | 11.6 | 12.5 | 6.5 | 0.51 | 10 |
| Ex. 8 | — | 15 | 40 | 13.0 | 11.6 | 25 | 5.8 | 0.52 | 8 |

TABLE 1-continued

"Manufacturing Condition and Property of Composite Hydroxide Particles"

| | Added Elements M | Ammonia Concentration (g/L) | Temp. In Tank (° C.) | Nucleation pH | Particle Growth pH | Timing Of Switching of Atmosphere (%) | Average Particle Size (μm) | (d90 − d10)/ average particle size | Thickness of Outer Shell Section (%) |
|---|---|---|---|---|---|---|---|---|---|
| CE. 1 | — | 15 | 40 | 11.0 (Continuous) | | — | 10.2 | 0.70 | Solid |
| CE. 2 | — | 15 | 40 | 11.6 | 11.6 | — | 9.2 | 0.63 | Solid |
| CE. 3 | — | 15 | 40 | 12.6 | 12.6 | — | — | — | — |
| CE. 4 | — | 15 | 40 | 13.0 | 11.6 | 12.5 | 5.3 | 0.49 | 11 |
| CE. 5 | — | 15 | 40 | 13.0 | 11.6 | 50 | 5.1 | 0.48 | 4 |

TABLE 2

"Manufacturing Condition and Property of Cathode Active Material"

| | Li/Me | Calcination Temp. (° C.) | Composition | Average Particle Size (μm) | (d90 − d10)/ average particle size | Thickness of Outer Shell Section (%) | Specific Surface Area (m$^2$/g) | Initial Discharge Capacity (mAh/g) | Cathode Resistance (%) | Capacity Retention Rate After 200 Cycles (%) |
|---|---|---|---|---|---|---|---|---|---|---|
| Ex. 1 | 1.35 | 900 | Li$_{1.36}$Ni$_{0.50}$Mn$_{0.50}$O$_2$ | 4.8 | 0.49 | 12 | 1.5 | 208.7 | 8.2 | 85 |
| Ex. 2 | 1.25 | 860 | Li$_{1.25}$Ni$_{0.50}$M$_{0.50}$O$_2$ | 4.8 | 0.49 | 12 | 1.6 | 202.3 | 8.9 | 84 |
| Ex. 3 | 1.35 | 900 | Li$_{1.36}$Ni$_{0.50}$Mn$_{0.50}$O$_2$ | 4.5 | 0.49 | 13 | 1.3 | 204.4 | 8.6 | 84 |
| Ex. 4 | 1.35 | 900 | Li$_{1.36}$Ni$_{0.4925}$Mn$_{0.4925}$W$_{0.005}$O$_2$ | 4.7 | 0.50 | 11 | 1.4 | 205.6 | 7.2 | 85 |
| Ex. 5 | 1.36 | 900 | Li$_{1.36}$Ni$_{0.4925}$Mn$_{0.4925}$Zr$_{0.005}$O$_2$ | 4.7 | 0.51 | 11 | 1.4 | 206.8 | 8.4 | 87 |
| Ex. 6 | 1.10 | 900 | Li$_{1.10}$Ni$_{0.50}$Mn$_{0.50}$O$_2$ | 4.8 | 0.50 | 10 | 1.5 | 201.9 | 10.2 | 85 |
| Ex. 7 | 1.35 | 900 | Li$_{1.36}$Ni$_{0.50}$Mn$_{0.50}$O$_2$ | 5.9 | 0.53 | 11 | 1.5 | 205.8 | 8.4 | 85 |
| Ex. 8 | 1.35 | 900 | Li$_{1.36}$Ni$_{0.50}$Mn$_{0.50}$O$_2$ | 5.0 | 0.55 | 9.6 | 1.7 | 206.6 | 8.3 | 83 |
| CE. 1 | 1.35 | 900 | Li$_{1.36}$Ni$_{0.50}$Mn$_{0.50}$O$_2$ | 10.5 | 0.73 | Solid | 1.4 | 208.2 | 30.5 | 78 |
| CE. 2 | 1.35 | 900 | Li$_{1.36}$Ni$_{0.50}$Mn$_{0.50}$O$_2$ | 8.5 | 0.68 | Solid | 1.4 | 207.1 | 18.3 | 81 |
| CE. 3 | — | — | — | — | — | — | — | — | — | — |
| CE. 4 | 1.35 | 1000 | Li$_{1.36}$Ni$_{0.50}$Mn$_{0.50}$O$_2$ | 12.7 | 0.72 | 10 | 1.2 | — | — | — |
| CE. 5 | 1.35 | 900 | Li$_{1.36}$Ni$_{0.50}$Mn$_{0.50}$O$_2$ | 8.5 | 0.74 | 5.4 | 1.8 | 175.3 | 12.8 | — |

(Evaluation)

The composite hydroxide particles and cathode active material of Examples 1 to 7 were manufactured according to the present invention, so the value [(d90−d10)/average particle size], which is an index that indicates the average particle size and range of the particle size distribution, is in the preferable range in all cases, the particle size distribution was good and the particle size was mostly uniform. All of the cathode active materials comprised an outer shell section in which aggregate primary particles were sintered, and a hollow section on the inside. Coin batteries in which these cathode active materials were used had a high initial discharge capacity, excellent cyclability, and low cathode resistance, and were batteries having excellent characteristics.

In Comparative Example 1, a continuous crystallization method was used, so nucleation and particle growth could not be separated, and because the particle growth time was not fixed, there was a large particle size distribution. Therefore, the coin battery had a high initial discharge capacity, however the cyclability was bad.

In Comparative Example 2, the pH value was 12 or less during both nucleation and particle growth, so the nucleation amount was insufficient, and both the composite hydroxide particles and cathode active material had a large particle size. Therefore, the coin battery had insufficient reaction surface area, and the cathode resistance was higher than in the examples of the invention.

In Comparative Example 3, the pH value was 12 or greater during both nucleation and particle growth, so new nuclei were generated during the entire crystallization reaction, and particles became fine and aggregated, and thus the particle size distribution became large and manufacture of the cathode active material became difficult.

In Comparative Example 4, the manufacturing process of the cathode active material is not according to the present invention, so it was not possible to obtain cathode active material having good characteristics.

In Comparative Example 5, the air atmosphere during the particle growth process was long, so the low-density sections became too large and when creating the cathode active material, the particles became large and rough, so the battery characteristics greatly worsened. The discharge characteristic was low, so the cyclability was not measured.

From the results above, it can be seen that by manufacturing nickel composite hydroxide particles and cathode active material using the manufacturing method of the present invention, a non-aqueous electrolyte secondary battery that uses this cathode active material has high initial discharge capacity, excellent cyclability, and low cathode resistance, and is a battery having excellent characteristics.

Example 9

Except for adjusting the pH value of the aqueous solution before reaction to 12.8 at a standard solution temperature of 25° C., adjusting the ammonia concentration in solution to 10 g/L, using a 1.8 mol/L mixed aqueous solution that was obtained by dissolving nickel sulfate, cobalt sulfate, manganese sulfate and zirconium sulfate in water such that the mole ratio of the metals was Ni:Co:Mn:Zr=33.2:33.1:33.3:0.5, controlling the pH value of the reaction solution during nucleation to 12.8, starting the circulation of nitrogen at the start of the particle growth process, switching from an air atmosphere to a nitrogen atmosphere (at 0% of the overall particle growth process time from the start of the particle growth process), maintaining the ammonia concentration at the value above, controlling the pH value of the reaction solution during particle growth to 11.6, performing crystallization for 2 hours, then removing half of the supernatant liquid and further performing crystallization for 2 hours, nickel manganese composite hydroxide that is expressed as $Ni_{0.332}Co_{0.331}Mn_{0.332}Zr_{0.005}(OH)_{2+a}$ ($0 \leq a \leq 0.5$) was obtained in the same way as Example 1.

Next, except for performing heat treatment of the obtained composite hydroxide for 12 hours at 150° C., using lithium carbonate as a lithium compound to obtain a lithium mixture such that Li/M=1.15, performing temporary calcination of the obtained lithium mixture for 4 hours at 760° C. in air, and performing calcination for 10 hours at 950° C., cathode active material expressed as $Li_{1.15}Ni_{0.332}Co_{0.331}Mn_{0.332}Zr_{0.005}O_2$, where Li was 7.93% by weight, Ni was 19.2% by weight, Co was 19.3% by weight, Mn was 18.0% by weight and Zr was 0.45% by weight was obtained in the same way as Example 1.

Moreover, the obtained composite hydroxide and the cathode active material for a non-aqueous electrolyte secondary battery were evaluated in the same way as in Example 1.

The characteristics of the composite hydroxide obtained in this example are given in Table 3, and the characteristics of the cathode active materials and evaluation of coin batteries that were manufactured using the cathode active materials are given in Table 4. The same contents are given in Table 3 and Table 4 for the Examples 9 to 12 and the Comparative Example 6 to 8.

Example 10

Except for simultaneously and continuously adding sodium tungstate aqueous solution during the reaction crystallization, nickel manganese composite hydroxide that is expressed as $Ni_{0.33}Co_{0.33}Mn_{0.33}Zr_{0.005}W_{0.005}(OH)_{2+a}$ ($0 \leq a \leq 0.5$) was obtained in the same way as Example 9, and heat treatment was performed. Except for a calcination temperature of 930° C., cathode active material expressed as $Li_{1.15}Ni_{0.33}Co_{0.33}Mn_{0.33}Zr_{0.005}W_{0.005}O_2$, where Li was 8.07% by weight, Ni was 19.6% by weight, Co was 19.7% by weight, Mn was 18.3% by weight, Zr was 0.46% by weight and W was 0.93% by weight was obtained in the same way as in Example 9.

Example 11

Except for changing the pH value to 12.6 and changing the time that the mixed aqueous solution is added from 2 minutes 30 seconds to 30 seconds in the nucleation process, starting the circulation of nitrogen 60 minutes after the start of the particle growth process, switching from an air atmosphere to a nitrogen atmosphere at 25% the overall particle growth process time from the start of the particle growth process, and maintaining the ammonia concentration at 5 g/L in the nucleation process and particle growth process, nickel cobalt manganese composite hydroxide was obtained in the same way as in Example 10, after which heat treatment and calcination were performed to obtain cathode active material. The composition of the obtained composite hydroxide and the cathode material were the same as in Example 10.

Example 12

Except for performing adjustment of the composite hydroxide so that the composition of Ni, Co and Mn became x=0.50, y=0.25 and z=0.25, the same nickel manganese composite hydroxide was obtained. Except for the an Li/M ratio of 1.05, calcination conditions of 850° C. and 10 hours, cathode active material expressed as $Li_{1.05}Ni_{0.495}Co_{0.248}Mn_{0.247}Zr_{0.005}W_{0.005}O_2$, where Li was 7.19% by weight, Ni was 28.7% by weight, Co was 14.4% by weight, Mn was 13.4% by weight, Zr was 0.45% by weight and W was 0.91% by weight was obtained in the same way as in Example 1.

Example 13

Cathode active material that was obtained in the same way as in Example 9 was dried in a fluidized drier (Powrex Corp.; MP-01) at 180° C. while blowing hot air and causing sodium tungstate solution to be sprayed, and a cathode active material, the surface of which is coated with sodium tungstate, is obtained. The composition of the obtained active material is the same as in Example 10, and through SEM observation of this cross section by EDX diffraction, it was confirmed that there was much tungsten on the surface of the active material particles.

Example 14

Except for dispersing composite hydroxide that was obtained in the same way as in Example 9 into ammonium tungstate solution to 150 g/L, turning the solution into a slurry, and spray drying that slurry by using a micro mist dryer (Fujisaki Electric Co., Ltd; MDL-050M) to obtain a composite hydroxide that is coated with ammonium tungstate salt, cathode active material was obtained in the same way as in Example 10. The composition of the obtained active material was the same as in Example 10, and through SEM observation of this cross section by EDX diffraction, it was confirmed that there was much tungsten on the surface of the active material particles.

Comparative Example 6

Except that the calcination conditions were 1050° C. and 10 hours, a composite oxide cathode active material was obtained in the same way as in Example 9. Sintering proceeded at a high calcination temperature, so the specific surface area was low, and the cathode resistance value became high.

Comparative Example 7

Except for causing nitrogen to flow during the crystallization reaction in the nucleation process and particle growth process, and using a non-oxidizing atmosphere (oxygen: 0.2% by volume or less), cathode active material was obtained in the same way as in Example 10.

The overall composite hydroxide particles were composed of the same kind of primary particles as the outer shell section in Example 10, and the structure of the cathode active material was dense, so the specific surface area was low, and the cathode resistance became high.

Comparative Example 8

Except for causing nitrogen to flow during the crystallization reaction in the nucleation process and particle growth process, and using a non-oxidizing atmosphere (oxygen: 0.2% by volume or less), a lithium nickel cobalt manganese composite oxide was obtained in the same way as in Example 12.

The overall composite hydroxide particles were composed of the same kind of primary particles as the outer shell section in Example 10, and the structure of the cathode active material was dense, so the specific surface area was low, and the cathode resistance became high.

EXPLANATION OF REFERENCE NUMBERS

1 Coin type battery
2 Case
2a Cathode can
2b Anode can
2c Gasket
3 Electrodes
3a Cathode
3b Anode
3c Separator

What is claimed is:

1. A manufacturing method for manufacturing nickel manganese composite hydroxide particles using a reaction crystallization, the nickel manganese composite hydroxide particles being expressed by a general formula of $Ni_xMn_yCo_zM_t(OH)_{2+a}$ (where $x+y+z+t=1$, $0.3 \leq x \leq 0.7$, $0.1 \leq y \leq 0.55$, $0 \leq z \leq 0.4$, $0 \leq t \leq 0.1$, $0 \leq a \leq 0.5$, and M is one or more added elements that are selected from among Mg, Ca, Al, Ti, V, Cr, Zr, Nb, Mo and W), the manufacturing method using a batch reaction tank that does not collect the nickel manganese composite hydroxide particles until the reaction thereof is complete; and the manufacturing method comprising:

a nucleation step of controlling an aqueous solution for nucleation, which includes at least a metallic compound that contains nickel, a metallic compound that

TABLE 3

"Manufacturing Condition and Property of Composite Hydroxide Particles"

| | Added Elements M | Ammonia Concentration (g/L) | Temp. In Tank (° C.) | Nucleation pH | Particle Growth pH | Timing Of Switching of Atmosphere (%) | Average Particle Size (μm) | (d90 − d10)/ average particle size | Thickness of Outer Shell Section (%) |
|---|---|---|---|---|---|---|---|---|---|
| Ex. 9 | Zr | 10 | 40 | 12.8 | 11.6 | 0 | 3.9 | 0.49 | 35 |
| Ex. 10 | Zr, W | 10 | 40 | 12.8 | 11.6 | 0 | 4.3 | 0.46 | 35 |
| Ex. 11 | Zr, W | 5 | 40 | 12.6 | 11.6 | 25 | 4.6 | 0.46 | 11 |
| Ex. 12 | Zr, W | 5 | 40 | 12.6 | 11.6 | 25 | 6.1 | 0.51 | 13 |
| Ex. 13 | Zr, W | 10 | 40 | 12.8 | 11.6 | 0 | 3.9 | 0.49 | 35 |
| Ex. 14 | Zr, W | 10 | 40 | 12.8 | 11.6 | 0 | 3.9 | 0.49 | 35 |
| CE. 6 | Zr | 10 | 40 | 12.8 | 11.6 | 0 | 3.9 | 0.49 | 35 |
| CE. 7 | Zr, W | 10 | 40 | 12.8 | 11.6 | — | 4.2 | 0.50 | Homo * |
| CE. 8 | Zr, W | 5 | 40 | 12.6 | 11.6 | — | 6.5 | 0.53 | Homo * |

Note:
Homo = Homogeneous

TABLE 4

"Manufacturing Condition and Property of Cathode Active Material"

| | Li/Me | Calcination Temp. (° C.) | Composition | Average Particle Size (μm) | (d90 − d10)/ average particle size | Thickness of Outer Shell Section (%) | Specific Surface Area (m²/g) | Initial Discharge Capacity (mAh/g) | Cathode Resistance (%) | Capacity Retention Rate After 200 Cycles (%) |
|---|---|---|---|---|---|---|---|---|---|---|
| Ex. 9 | 1.15 | 950 | $Li_{1.15}Ni_{0.332}Co_{0.331}Mn_{0.332}Zr_{0.005}O_2$ | 4.5 | 0.51 | 36 | 1.2 | 155.1 | 4.4 | 91 |
| Ex. 10 | 1.15 | 930 | $Li_{1.15}Ni_{0.33}Co_{0.33}Mn_{0.33}Zr_{0.005}W_{0.005}O_2$ | 4.6 | 0.46 | 36 | 1.6 | 154.7 | 4.0 | 92 |
| Ex. 11 | 1.15 | 900 | $Li_{1.15}Ni_{0.33}Co_{0.33}Mn_{0.33}Zr_{0.005}W_{0.005}O_2$ | 4.7 | 0.49 | 12 | 1.8 | 156.7 | 3.9 | 93 |
| Ex. 12 | 1.05 | 850 | $Li_{1.05}Ni_{0.495}Co_{0.248}Mn_{0.247}Zr_{0.005}W_{0.005}O_2$ | 6.2 | 0.50 | 14 | 1.1 | 170.2 | 4.4 | 88 |
| Ex. 13 | 1.15 | 950 | $Li_{1.15}Ni_{0.33}Co_{0.33}Mn_{0.33}Zr_{0.005}W_{0.005}O_2$ | 4.5 | 0.50 | 36 | 1.3 | 155.0 | 4.1 | 92 |
| Ex. 14 | 1.15 | 950 | $Li_{1.15}Ni_{0.33}Co_{0.33}Mn_{0.33}Zr_{0.005}W_{0.005}O_2$ | 4.4 | 0.51 | 36 | 1.2 | 155.3 | 4.2 | 91 |
| CE. 6 | 1.15 | 1050 | $Li_{1.15}Ni_{0.332}Co_{0.331}Mn_{0.332}Zr_{0.005}O_2$ | 11.5 | 0.92 | 45 | 0.42 | 141.4 | 8.6 | — |
| CE. 7 | 1.15 | 930 | $Li_{1.15}Ni_{0.33}Co_{0.33}Mn_{0.33}Zr_{0.005}W_{0.005}O_2$ | 4.4 | 0.51 | Solid | 0.85 | 155.6 | 5.1 | 90 |
| CE. 8 | 1.05 | 850 | $Li_{1.05}Ni_{0.495}Co_{0.248}Mn_{0.247}Zr_{0.005}W_{0.005}O_2$ | 6.2 | 0.51 | Solid | 0.6 | 170.7 | 5.5 | 89 |

INDUSTRIAL APPLICABILITY

The non-aqueous electrolyte secondary battery of the present invention is suitable as a power source for compact electronic devices (notebook type personal computer, mobile telephone, and the like).

Moreover, the non-aqueous electrolyte secondary battery of the present invention has excellent safety characteristics, is compact and has high output, so is suitable for use as a power source of conveying equipment with limited space.

contains manganese, and an ammonium ion donor, so that a pH value thereof that is measured at a standard solution temperature of 25° C. is 12.0 to 14.0, and causing nucleation in an oxidizing atmosphere having an oxygen concentration of greater than 1% by volume; and a particle growth step of controlling an aqueous solution for particle growth, which includes nuclei formed in the nucleation step, so that a pH value that is measured at a standard solution temperature of 25° C. is 10.5 to 12.0, the pH value of the particle growth step being at least 0.5 less than the pH value of the nucleation step, and causing nuclear growth by switching from the oxidizing atmosphere to a mixed atmosphere of oxygen and inert gas having an oxygen concentration of 1% by volume or less within a range of 0 to 40% of the overall time of the particle growth step from the start of the particle growth step.

2. The manufacturing method for manufacturing nickel manganese composite hydroxide particles according to claim 1, wherein the oxygen concentration in the oxidizing atmosphere is 10% by volume or greater.

3. The manufacturing method for manufacturing nickel manganese composite hydroxide particles according to claim 1, wherein the oxygen concentration in the mixed atmosphere is 0.5% by volume or less.

4. The manufacturing method for manufacturing nickel manganese composite hydroxide particles according to claim 1, wherein switching in the particle growth step from the oxidizing atmosphere to the mixed atmosphere of oxygen and inert gas is performed within a range of 0 to 30% of the overall time of the particle growth step from the start of the particle growth step.

5. The manufacturing method for manufacturing nickel manganese composite hydroxide particles according to claim 1, wherein the aqueous solution for particle growth is obtained by adjusting the pH value of the aqueous solution for nucleation after the nucleation step has finished.

6. The manufacturing method for manufacturing nickel manganese composite hydroxide particles according to claim 1, wherein the aqueous solution for particle growth is obtained by adding the aqueous solution for nucleation, which contains the nuclei formed in the nucleation step, to a solution that is separate from the aqueous solution for nucleation with the formed nuclei.

7. The manufacturing method for manufacturing nickel manganese composite hydroxide particles according to claim 1, wherein, in the particle growth step, part of a liquid part of the aqueous solution for particle growth is excreted.

8. The manufacturing method for manufacturing nickel manganese composite hydroxide particles according to claim 1, wherein, in the nucleation step and the particle growth step, a temperature of the aqueous solution for nucleation and for particle growth is maintained at 20° C. or greater.

9. The manufacturing method for manufacturing nickel manganese composite hydroxide particles according to claim 1, wherein, in the nucleation step and the particle growth step, an ammonia concentration of the aqueous solution for nucleation and for particle growth is maintained within a range of 3 to 25 g/L.

10. The manufacturing method for manufacturing nickel manganese composite hydroxide particles according to claim 1 further comprising a step of coating the nickel manganese composite hydroxide particles obtained in the particle growth step with a compound containing the one or more added elements.

11. Nickel manganese composite hydroxide particles that are expressed by a general formula of $Ni_xMn_yCo_zM_t(OH)_{2+a}$ (where $x+y+z+t=1$, $0.3 \leq x \leq 0.7$, $0.1 \leq y \leq 0.55$, $0 \leq z \leq 0.4$, $0 \leq t \leq 0.1$, $0 \leq a \leq 0.5$, and M is one or more added elements that are selected from among Mg, Ca, Al, Ti, V, Cr, Zr, Nb, Mo and W), and that are spherical shaped secondary particles that are formed by a plurality of aggregate primary particles, wherein the secondary particles have an average particle size of 3 to 7 μm, a value [(d90−d10)/average particle size], which is an index indicating an extent of particle size distribution thereof, of 0.55 or less, and wherein the secondary particles have a center section comprising fine primary particles, and an outer shell section on the outside of the center section comprising plate shaped primary particles that are larger than the fine primary particles.

12. The nickel manganese composite hydroxide particles according to claim 11, wherein the fine primary particles have an average particle size of 0.01 to 0.3 μm, and the plate shaped primary particles that are larger than the fine primary particles have an average particle size of 0.3 to 3 μm.

13. The nickel manganese composite hydroxide particles according to claim 11, wherein a ratio of the thickness of the outer shell section with respect to the particle size of the secondary particles is 5 to 45%.

14. The nickel manganese composite hydroxide particles according to claim 11, wherein the one or more added elements are uniformly distributed inside the secondary particles and/or uniformly cote the surface of the secondary particles.

15. A manufacturing method for manufacturing a cathode active material for a non-aqueous electrolyte secondary battery comprising lithium nickel manganese composite oxide having a layered hexagonal crystal structure and expressed by a general formula of $Li_{1+u}Ni_xMn_yCo_zM_tO_2$ (where $-0.05 \leq u \leq 0.50$, $x+y+z+t=1$, $0.3 \leq x \leq 0.7$, $0.1 \leq y \leq 0.55$, $0 \leq z \leq 0.4$, $0 \leq t \leq 0.1$, M is one or more added elements that are selected from among Mg, Ca, Al, Ti, V, Cr, Zr, Nb, Mo and W), the manufacturing method comprising:
heat treatment of the nickel manganese composite hydroxide particles of claim 11 at a temperature of 105 to 750° C.,
a mixing step that mixes a lithium compound into the heat treated particles to form a lithium mixture; and
a calcination step that performs calcination of the mixture formed in the mixing step in an oxidizing atmosphere at a temperature of 800 to 980° C.

16. The manufacturing method for manufacturing cathode active material for a non-aqueous electrolyte secondary battery according to claim 15, wherein the lithium mixture is adjusted so that a ratio between the sum of the number of metal atoms other than lithium included in the lithium mixture and the number of lithium atoms is 1:0.95 to 1.5.

17. The manufacturing method for manufacturing cathode active material for a non-aqueous electrolyte secondary battery according to claim 15, wherein, in the calcination step, temporary calcination has already been performed before calcination at a temperature of 350 to 800° C.

18. The manufacturing method for manufacturing cathode active material for a non-aqueous electrolyte secondary battery according to claim 15, wherein the oxidizing atmosphere during the calcination step is an atmosphere having an oxygen content of 18 to 100% by volume.

19. A manufacturing method for manufacturing a cathode active material for a non-aqueous electrolyte secondary battery comprising lithium nickel manganese composite oxide having a layered hexagonal crystal structure and expressed by a general formula of $Li_{1+u}Ni_xMn_yCo_zM_tO_2$ (where $-0.05 \leq u \leq 0.50$, $x+y+z+t=1$, $0.3 \leq x \leq 0.7$, $0.1 \leq y \leq 0.55$, $0 \leq z \leq 0.4$, $0 \leq t \leq 0.1$, M is one or more added elements that are selected from among Mg, Ca, Al, Ti, V, Cr, Zr, Nb, Mo and W), the manufacturing method comprising:

heat treatment of the nickel manganese composite hydroxide particles of claim 12 at a temperature of 105 to 750° C., a mixing step that mixes a lithium compound into the heat treated particles to form a lithium mixture; and a calcination step that performs calcination of the mixture formed in the mixing step in an oxidizing atmosphere at a temperature of 800 to 980° C.

20. A manufacturing method for manufacturing a cathode active material for a non-aqueous electrolyte secondary battery comprising lithium nickel manganese composite oxide having a layered hexagonal crystal structure and expressed by a general formula of $Li_{1+u}Ni_xMn_yCo_zM_tO_2$ (where $-0.05 \leq u \leq 0.50$, $x+y+z+t=1$, $0.3 \leq x \leq 0.7$, $0.1 \leq y \leq 0.55$, $0 \leq z \leq 0.4$, $0 \leq t \leq 0.1$, M is one or more added elements that are selected from among Mg, Ca, Al, Ti, V, Cr, Zr, Nb, Mo and W), the manufacturing method comprising:

heat treatment of the nickel manganese composite hydroxide particles of claim 13 at a temperature of 105 to 750° C., a mixing step that mixes a lithium compound into the heat treated particles to form a lithium mixture; and a calcination step that performs calcination of the mixture formed in the mixing step in an oxidizing atmosphere at a temperature of 800 to 980° C.

* * * * *